US012704556B2

(12) United States Patent
Ibrahim et al.

(10) Patent No.: US 12,704,556 B2
(45) Date of Patent: Aug. 11, 2026

(54) EXCITATION FOR SPECTROSCOPY

(71) Applicant: Texas Instruments Incorporated, Dallas, TX (US)

(72) Inventors: Bassem Ibrahim, Allen, TX (US); Branko Majmunovic, Dallas, TX (US); David P Magee, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 125 days.

(21) Appl. No.: 18/617,944

(22) Filed: Mar. 27, 2024

(65) Prior Publication Data

US 2025/0102587 A1 Mar. 27, 2025

Related U.S. Application Data

(60) Provisional application No. 63/584,422, filed on Sep. 21, 2023.

(51) Int. Cl.
*G01R 31/389* (2019.01)
*G01R 31/367* (2019.01)
*G01R 31/3842* (2019.01)

(52) U.S. Cl.
CPC ......... *G01R 31/389* (2019.01); *G01R 31/367* (2019.01); *G01R 31/3842* (2019.01)

(58) Field of Classification Search
None
See application file for complete search history.

(56) References Cited

U.S. PATENT DOCUMENTS

2015/0145520 A1* 5/2015 Kain ..................... H02J 7/0016 324/430
2017/0018945 A1* 1/2017 Ohtake .............. G01R 31/3835
2017/0160348 A1* 6/2017 Din ........................ H02J 7/0014
2020/0132781 A1* 4/2020 Marsili ................ G01R 31/389
2021/0333328 A1 10/2021 Chung
2023/0092047 A1* 3/2023 Zhang ..................... H02J 9/062 307/66

OTHER PUBLICATIONS

European Patent Office, PCT Search Report and Written Opinion, mailed Dec. 16, 2024, 12 pages.

* cited by examiner

*Primary Examiner* — Jas A Sanghera
(74) *Attorney, Agent, or Firm* — Zhenhai Fu; Frank D. Cimino

(57) ABSTRACT

An apparatus includes a charge transfer circuit, a control circuit, and a processing circuit. The charge transfer circuit has a first terminal, a second terminal, a third terminal, and a control input. The control circuit has a control output coupled to the control input. The processing circuit has a first input, a second input, and an output. The processing circuit is configured to receive a first signal at the first input and receive a second signal at the second input. The first signal represents a current through the charge transfer circuit. The second signal represents at least one of a first voltage between the first and second terminals or a second voltage between the second and third terminals. The processing circuit is also configured to provide a third signal based on the first and second signals at the output.

20 Claims, 16 Drawing Sheets

EXCITATION FOR SPECTROSCOPY

CROSS-REFERENCE TO RELATED APPLICATIONS

This application claims priority to U.S. Provisional Application No. 63/584,422, filed Sep. 21, 2023, entitled "Circuit and Excitation Method for Power-Efficient EIS (Electrochemical Impedance Spectroscopy)," and is related to U.S. patent application Ser. Nos. 18/340,399 and 18/340,476, filed Jun. 23, 2023, entitled "Active Cell Balancing," which are hereby incorporated by reference by their entireties.

BACKGROUND

Spectroscopy is commonly used in several fields such as electrical spectroscopy, mechanical spectroscopy, optical spectroscopy and electrochemical impedance spectroscopy. One way of performing a spectroscopy measurement is by providing an excitation stimulus (e.g., a voltage or a current) to a device under test (e.g., a battery), and measuring a response of the device under test (DUT) to the stimulus (e.g., a voltage response to a current stimulus, a current response to a voltage stimulus), and repeating the excitation and response measurement at different frequencies. A challenge with spectroscopy measurement is that the energy spent in generating the stimulus (e.g., in the form of charge for a current stimulus) may be lost after the measurement, which reduces the overall power efficiency of the system, especially for a battery management system that draws power from the batteries that are being managed and monitored.

SUMMARY

In one example, an apparatus includes a charge transfer circuit, a control circuit, and a processing circuit. The charge transfer circuit has a first terminal, a second terminal, a third terminal, and a control input. The control circuit has a control output coupled to the control input. The processing circuit has a first input, a second input, and an output. The processing circuit is configured to receive a first signal at the first input and receive a second signal at the second input. The first signal represents a current through the charge transfer circuit. The second signal represents at least one of a first voltage between the first and second terminals or a second voltage between the second and third terminals. The processing circuit is also configured to provide a third signal based on the first and second signals at the output.

In another example, a system includes a charge transfer circuit, an energy storage device, a control circuit, a first voltage sensor, a second voltage sensor, a current sensor, and a processing circuit. The charge transfer circuit has a first device under test (DUT) terminal, a second DUT terminal, a third DUT terminal, a first current terminal, a second current terminal, and a control input. The energy storage device and the current sensor are coupled between the first and second current terminals. The current sensor has a current sensor output. The control circuit has a control output coupled to the control input. The first voltage sensor is coupled between the first and second DUT terminals. The first voltage sensor has a first voltage sensor output. The second voltage sensor is coupled between the second and third DUT terminals. The second voltage sensor has a second voltage sensor output. The processing circuit has first, second, and third sense inputs and an output. The first sense input is coupled to the first voltage sensor output. The second sense input is coupled to the second voltage sensor output. The third sense input is coupled to the current sensor output.

In a further example, a method includes transferring a charge from a first DUT to a second DUT through a circuit. The method also includes measuring a current through the circuit resulting from the charge, and measuring at least one of a first voltage across the first DUT or a second voltage across the second DUT. The method further includes generating at least one of a first impedance spectroscopy of the first DUT or a second impedance spectroscopy of the second DUT based on the current and the at least one of the first or second voltages.

DETAILED DESCRIPTION

Figure 1:
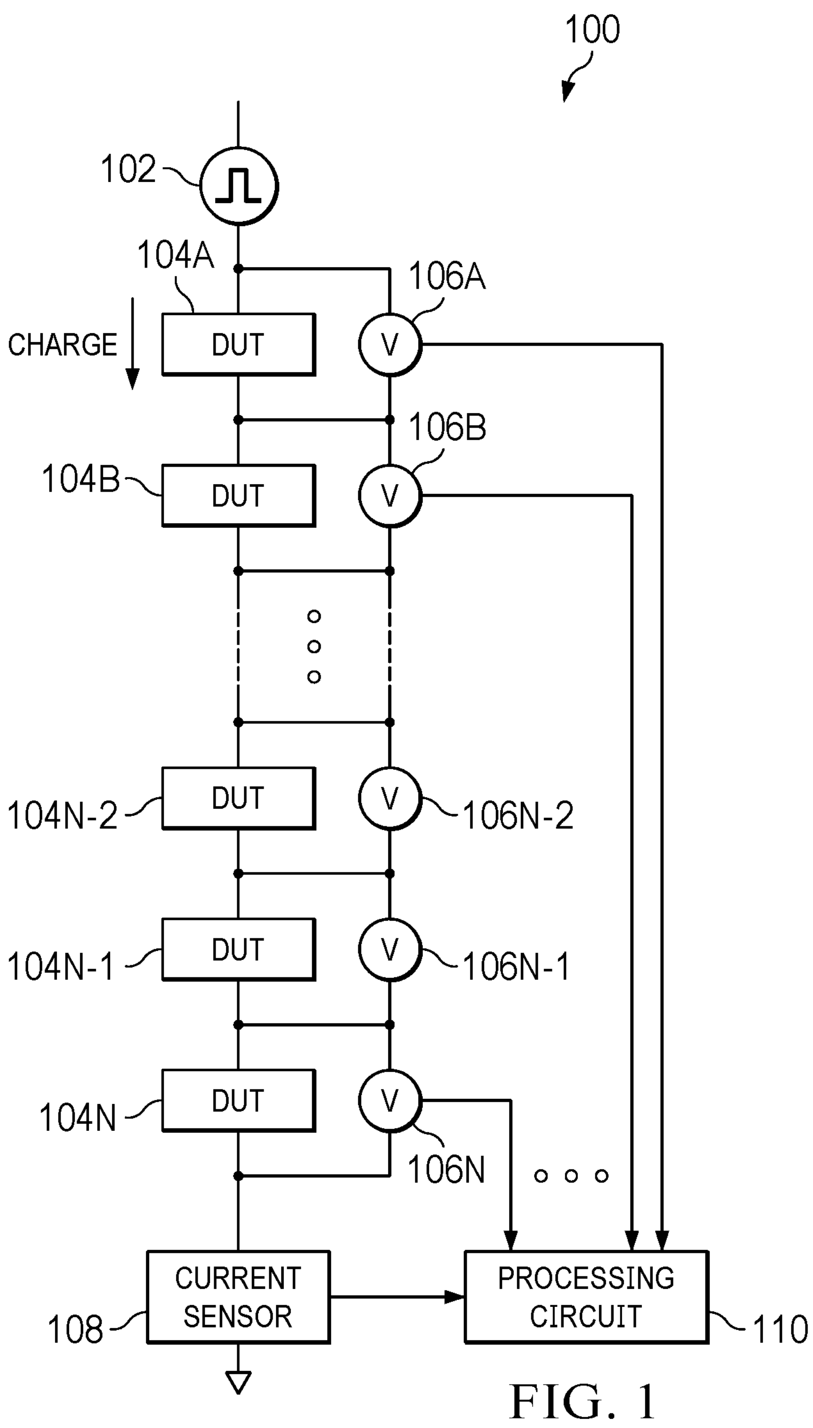
FIG. 1 is a block diagram of an example system for determining an attribute of a device under test.

Spectroscopy is commonly used in several fields such as electrical spectroscopy, mechanical spectroscopy, optical spectroscopy and electrochemical impedance spectroscopy. One way of performing a spectroscopy measurement is by providing an excitation stimulus (e.g., a voltage or a current) to a device under test (e.g., a battery), and measuring a response of the device under test (DUT) to the stimulus (e.g., a voltage response to a current stimulus, a current response to a voltage stimulus), and repeating the excitation and response measurement at different frequencies.

Spectroscopy measurement, such as electrochemical spectroscopy measurement, are performed on batteries to analyze the behavior of the battery, which can indicate various operation operations of the battery. Specifically, battery behavior varies while supplying current based on battery condition as well as environmental effects. Prediction of battery behavior during its run time is important to manage and improve the battery power supply to these devices. The battery condition is often characterized by the level of available charge, such as a state of charge (SOC), and the percentage of useful charge/discharge cycles that remain, such as a state of health (SOH). The prediction of battery parameters such as SOC, SOH, and temperature relies on mathematical models of the battery that estimates these parameters based on the chemical reactions inside the battery. Some battery models use lumped-parameter circuit representations with resistor and capacitor elements to model the battery behavior under different conditions.

The physical effects that occur inside a battery during charging, discharging, and aging can be represented as an equivalent circuit model that includes a series combination of a capacitor, a resistor, and several stages of a resistor and capacitor connected in parallel. The series capacitor represents the charge stored in the battery, the resistor represents the DC resistance of the battery cell, and the RC stages represent time constants for the variation of the instantaneous battery voltage.

The impedance of the battery can be determined from the equivalent circuit model once the parameter values have been determined using a characterization method. A given characterization method can determine the appropriate parameter values under the SOC, SOH, and environmental conditions encountered during the battery's lifetime. Most characterization methods apply an excitation signal to the battery across the range of reasonable operating conditions and estimate the circuit parameters that best model the measured responses.

The battery impedance spectrum, which is the ratio between the battery cell voltage and current in the frequency domain, has a strong correlation to battery SOC, SOH, and internal temperature. Measurement of battery impedance spectra in order to characterize their behavior is frequently referred to as electrochemical impedance spectroscopy (EIS). EIS measurements can be used to determine the SOC, SOH, or temperature parameters from the measured impedance, or to generate battery models when these parameters are measured via alternative means. A challenge with EIS measurement is that the energy spent in generating the stimulus (e.g., in the form of charge for a current stimulus) may be lost after the measurement, which reduces the overall power efficiency of the system, especially for a battery management system that draws power from the batteries that are being managed and monitored.

FIG. 1 is a block diagram of an example system 100 for determining an attribute of a device under test. The system 100 includes an excitation current source 102, multiple devices under test (DUTs) 104A, 104B, 104N-2, 104N-1, 104N (collectively DUTs 104), multiple voltage sensors 106A, 106B, 106N-2, 106N-1, 106N (collectively voltage sensors 106), a current sensor 108, and a processing circuit 110. The excitation current source 102, the DUTs 104, and the current sensor 108 are coupled in series, with the DUTS 104 coupled in series between the excitation current source 102 and the current sensor 108. The current sensor 108 is coupled between the DUTS 104 and a reference terminal (e.g., ground). The DUTs 104 can be electro-chemical battery cells, batteries made up of multiple battery cells (e.g., coupled in series), battery modules, or other energy storage devices such as capacitors.

The excitation current source 102 draws an excitation current from the DUTs 104. The excitation current can be a single sinusoidal current, or a combination of several sinusoidal currents. The current sensor 108 measures the current drawn by the excitation current source 102. The current sensor 108 can include a sense resistor and a current limiting resistor coupled in series. The voltage across the sense resistor represents the measured excitation current, and the current limiting resistor restricts the maximum current flow through the DUTs 104. In the system 100, the excitation current may flow to ground, and the power produced by the excitation current may be dissipated in the current limiting resistor.

Each of the voltage sensors 106 measures the voltage across one of the DUTs 104, and is coupled to a DUT 104 via a Kelvin connection. A Kelvin connection includes separate conductors for current and voltage sensing to ensure that no current flows in the voltage sensing wires because the voltage sensor 106 has high input impedance and doesn't allow current to flow into the inputs of the voltage sensor 106. The Kelvin connection allows the voltage sensor 106 to measure only the voltage across the DUT 104 and avoid any voltage drop on the conductor between the DUT 104 and the voltage sensor 106. For example, the DUT 104A is coupled between first and second terminals of the voltage sensor 106A, the DUT 104B is coupled between first and second terminals of the voltage sensor 106B, etc. A voltage measurement output of the each of the voltage sensors 106 is coupled to an input of the processing circuit 110.

The processing circuit 110 receives the current and voltage measurements from the current sensor 108 and the voltage sensors 106, and computes an impedance value for each DUT 104 based on the measured voltage across the DUT 104 and the measured excitation current. For example, the processing circuit 110 may sample and digitize the measured current and voltage signals received from the current sensor 108 and the voltage sensors 106, and compute a discrete Fourier transform (DFT) of the current and voltage signals. The system 100 can compute impedance values for each DUT 104 as a ratio of the voltage DFT and the current DFT at each excitation frequency. The processing circuit 110, or circuitry coupled to the processing circuit 110, can determine an attribute (temperature, SOC, SOH, etc.) of each of the DUT 104 based on the impedance values. The processing circuit 110 can include a processor executing instructions or hardware circuitry to perform the impedance and other computations.

One challenge posed by the system 100 is related to the large amount of charge lost from the DUT 104 during each EIS measurement to provide an excitation signal with a large amplitude. The excitation signal can have a large amplitude to allow high signal-to-noise ratio voltage and current measurements, which result in accurate impedance values. As the excitation amplitude increases, the drain of charge from the DUT 104 increases for each EIS measurement. The loss of charge is further exacerbated as the frequency of EIS measurements increases, which is needed to improve the efficiency and safety of the DUT 104.

Figure 2:
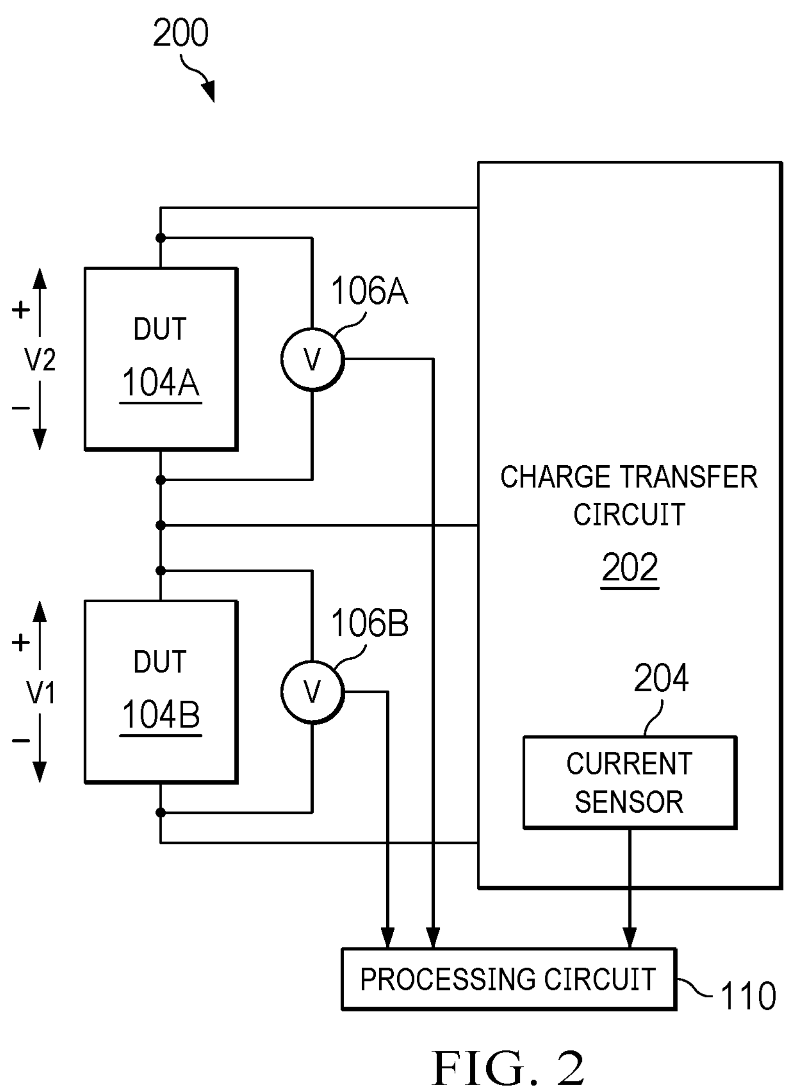
FIG. 2 is a block diagram for an example system for determining an attribute of devices under test using transfer of charge between the devices under test.

FIG. 2 is a block diagram for an example system 200 for determining an attribute of devices under test using transfer of charge between the devices under test. The system 200 reduces the power loss during EIS measurements, which leaves the DUTs with more capacity after EIS measurement. The system 200 moves charge through a DUT (or a group of DUT) to perform an EIS measurement of that DUT. After the charge is moved out of the DUT, instead of draining the charge to ground and thereby dissipating the charge energy, the system 200 can transfer the charge to a charge storage device, and then discharge the charge storage device and provide the charge to another DUT to perform an EIS measurement of that DUT. Accordingly, by transferring charge between DUTs to perform EIS, the system 200 can increase the operational life of the DUTs relative to the system 100 while reducing power loss caused by the EIS measurements.

The system 200 includes the DUTs 104A and 104B, the voltage sensors 106A and 106B, the processing circuit 110, and a charge transfer circuit 202. The DUTs 104A and 104B, the voltage sensors 106A and 106B, and the processing circuit 110 can be as described with regard to the system 100. The charge transfer circuit 202 can include a current sensor 204. Alternatively, the current sensor 204 can be provided external to the charge transfer circuit 202. The voltage sensors 106A and the voltage sensors 106B are coupled to the DUT 104A and the DUT 104B using Kelvin connections as described for the system 100. A first terminal of the voltage sensor 106A is coupled to the first terminal of the DUT 104A, and a second terminal of the voltage sensor 106A is coupled to the second terminal of the DUT 104A. A first terminal of the voltage sensor 106B is coupled to the first terminal of the DUT 104B, and a second terminal of the voltage sensor 106B is coupled to the second terminal of the DUT 104B. The second terminal of the DUT 104A is coupled to the first terminal of the DUT 104B.

The charge transfer circuit 202 has a first terminal coupled to the first terminal of the DUT 104A, a second terminal coupled to the second terminal of the DUT 104A and the first terminal of the DUT 104B, and a third terminal coupled to the second terminal of the DUT 104B. To characterize the DUT 104A, the charge transfer circuit 202 draws excitation current from the DUT 104A, stores the charge drawn from the DUT 104A, and transfers the charge to the DUT 104B. The current sensor 204 measures the excitation current drawn from the DUT 104A and provides a current measurement signal to the processing circuit 110. The voltage sensor 106A measures the voltage across the DUT 104A as the excitation current is drawn, and provides a voltage measurement signal to the processing circuit 110. The charge transfer circuit 202 includes a charge storage component that stores the energy of the excitation current. The charge transfer circuit 202 transfers the stored energy to the DUT 104B.

To characterize the DUT 104B, the charge transfer circuit 202 draws excitation current from the DUT 104B, stores the charge drawn from the DUT 104B, and transfers the charge to the DUT 104A. The current sensor 204 measures the excitation current drawn from the DUT 104B and provides a current measurement signal to the processing circuit 110. The voltage sensor 106B measures the voltage across the DUT 104B as the excitation current is drawn, and provides a voltage measurement signal to the processing circuit 110. The charge transfer circuit 202 stores the energy of the excitation current. The charge transfer circuit 202 transfers the stored energy to the DUT 104A. By transferring the energy of the excitation current between the DUTs, the system 200 can provide EIS with high excitation current while reducing the energy lost to the EIS measurement.

Figure 3:
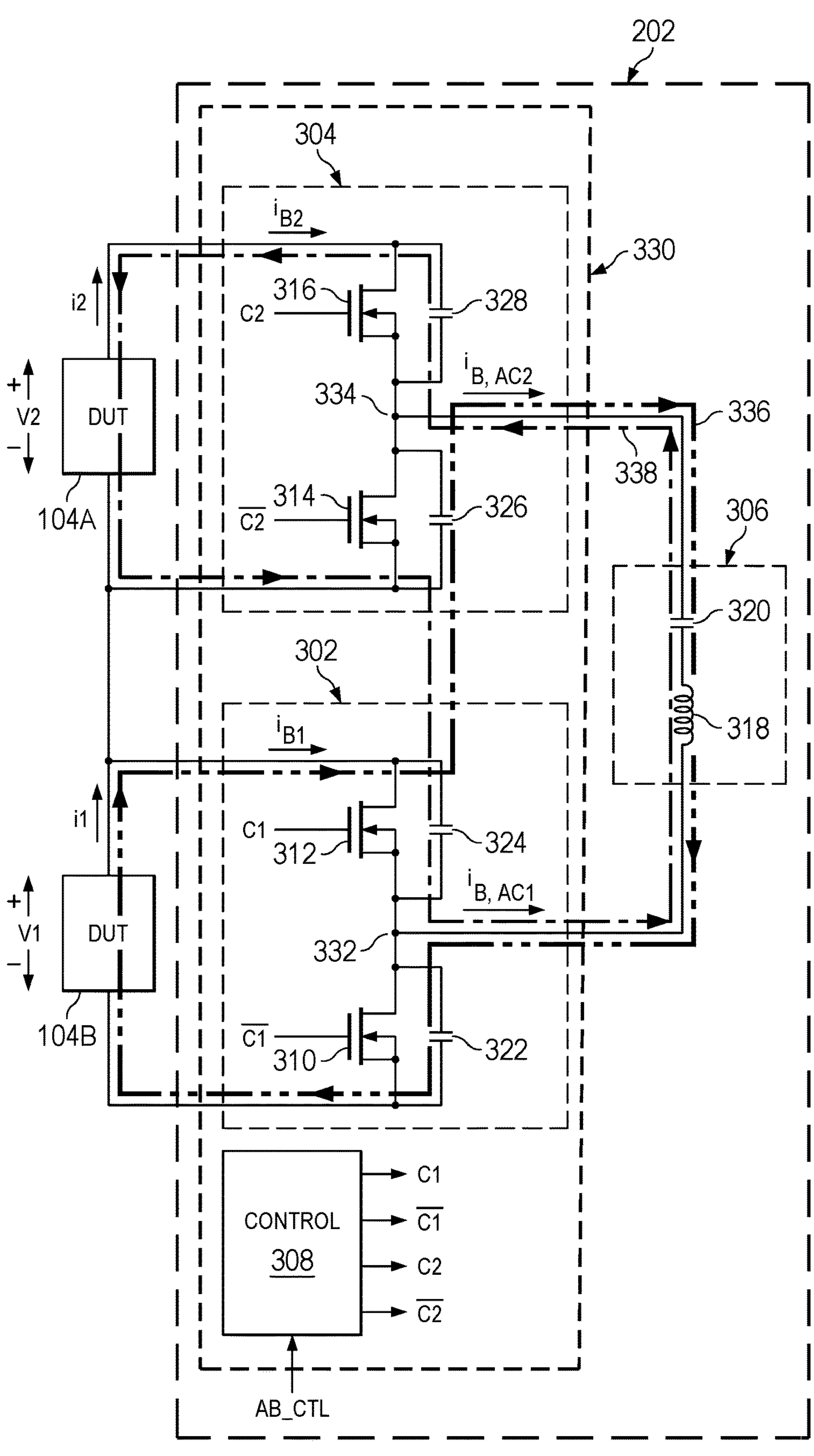
FIG. 3 is a schematic diagram of an example charge transfer circuit suitable for use in the system of FIG. 2.

FIG. 3 is a schematic diagram of a charge transfer circuit 202 (or a portion thereof) suitable for use in the system 200. FIG. 3 also shows the adjacent DUTs 104A and 104B coupled to the charge transfer circuit 202. The charge transfer circuit 202 includes a half-bridge circuit 302, a half-bridge circuit 304, an inductor-capacitor (LC) circuit 306, and a control circuit 308. The half-bridge circuit 302 is coupled in parallel with the DUT 104B, and includes a first terminal coupled to the first terminal of the DUT 104B, and a second terminal coupled to the second terminal of the DUT 104B. Similarly, the half-bridge circuit 304 is coupled in parallel with the DUT 104A, and includes a first terminal coupled to the first terminal of the DUT 104A, and a second terminal coupled to a second terminal of the DUT 104A.

Each half-bridge circuit includes a pair of transistors. The transistors can be n-channel field effect transistors (NFETs). The half-bridge circuit 302 includes transistors 310 and 312. A first terminal (e.g., source) of the transistor 310 is coupled to the second battery terminal, and a second terminal (e.g., drain) of the transistor 310 is coupled to a switch node 332. A capacitor 322 represents a drain-to-source capacitance of the transistor 310. A first terminal (e.g., source) of the transistor 312 is coupled to the switch node 332, and a second terminal (e.g., drain) of the transistor 312 is coupled to the first terminal of the half-bridge circuit 302. A capacitor 324 represents a drain-to-source capacitance of the transistor 312.

The half-bridge circuit 304 includes transistors 314 and 316, and a switch node 334. A first terminal (e.g., source) of the transistor 314 is coupled to the first terminal of the DUT 104A, and a second terminal (e.g., drain) of the transistor 314 is coupled to the switch node 334. A capacitor 326 represents a drain-to-source capacitance of the transistor 314. A first terminal (e.g., source) of the transistor 316 is coupled to the switch node 334, and a second terminal (e.g., drain) of the transistor 316 is coupled to a second terminal of the DUT 104A. A capacitor 328 represents a drain-to-source capacitance of the transistor 316.

The LC circuit 306 is coupled between the switch node 332 and the switch node 334. The LC circuit 306 includes an inductor 318 and a capacitor 320 coupled in series. The capacitor 320 capacitively couples the half-bridge circuit 302 and the half-bridge circuit 304. The capacitance of the capacitor 320 and the inductance of the inductor 318 can be relatively small. For example, the inductance of the inductor 318 may be 50 nanohenries (nH) and the capacitance of the capacitor 320 may be 3 microfarads (μF) in some implementations of the LC circuit 306. The voltage across the transistor 310, the transistor 312, the transistor 314, the transistor 316, the inductor 318, or the capacitor 320 can be limited to about the voltage of a single battery cell. Accordingly, the voltage rating of these components can be relatively low.

The control circuit 308 generates driver signals that control the transistors 310, 312, 314, and 316 to manage the drawing of excitation current and transfer of charge between the DUTs 104A and 104B. The control circuit 308 generates a switching cycle at the rate of switching frequency $f_{sw}$ that includes 2 phases—phase 1 and phase 2. One phase is used for discharging one of the DUTs into the LC circuit 306 which stores the transferred charge, and the other phase is used for charging the other DUT with the charge stored in the LC circuit 306.

FIG. 3 shows an example of charge transfer from the DUT 104B to the DUT 104A using the charge transfer circuit 202. During phase 1, charge is transferred from the DUT 104B to the LC circuit 306 (shown as path 336) by turning on the transistor 310 and turning off the transistor 312 in the half-bridge circuit 302 followed by turning on the transistor 314 and turning off transistor 316 after time delay $t_{delay}$.

During phase 2, charge is transferred from the LC circuit 306 to the DUT 104A (shown as path 338) by turning off the transistor 310 and turning on the transistor 312 of the half-bridge circuit 302 followed by turning off the transistor 314 and turning on the transistor 316 after the same time delay $t_{delay}$.

During phase 1, the current flows through the DUT 104B, while no current flows in the DUT 104A. Then in phase 2, the current flows through the cells of the DUT 104A in the opposite direction relative to phase 1, while no current flows in the DUT 104B. The amplitude of the current of each switching cycle is controlled by the phase φ(t) according to the desired sinusoidal excitation. The φ(t) can be positive or negative by lagging or leading the control signals of the half-bridge circuit 304 relative to the half-bridge circuit 302. Therefore, the excitation signal can be centered around zero without DC current to reduce power loss. The polarity of the amplitude of the excitation signal determines the polarity of φ(t) which controls the charging and discharging phases for the DUTs 104A and 104B. The average current in each DUT, which can be determined using a low-pass filter to remove the high-frequency switching components, can be equal to the desired sinusoidal excitation waveform through the DUTs. Using this approach, exchanging of charge between DUTs during a single EIS measurement can allow the DUTs to maintain their initial charge capacity with only small losses. Since the power loss through the circuit resistance is less than with the standard EIS measurement architecture (shown in FIG. 1), the DUTs retain more charge after the EIS measurement.

Figure 4:
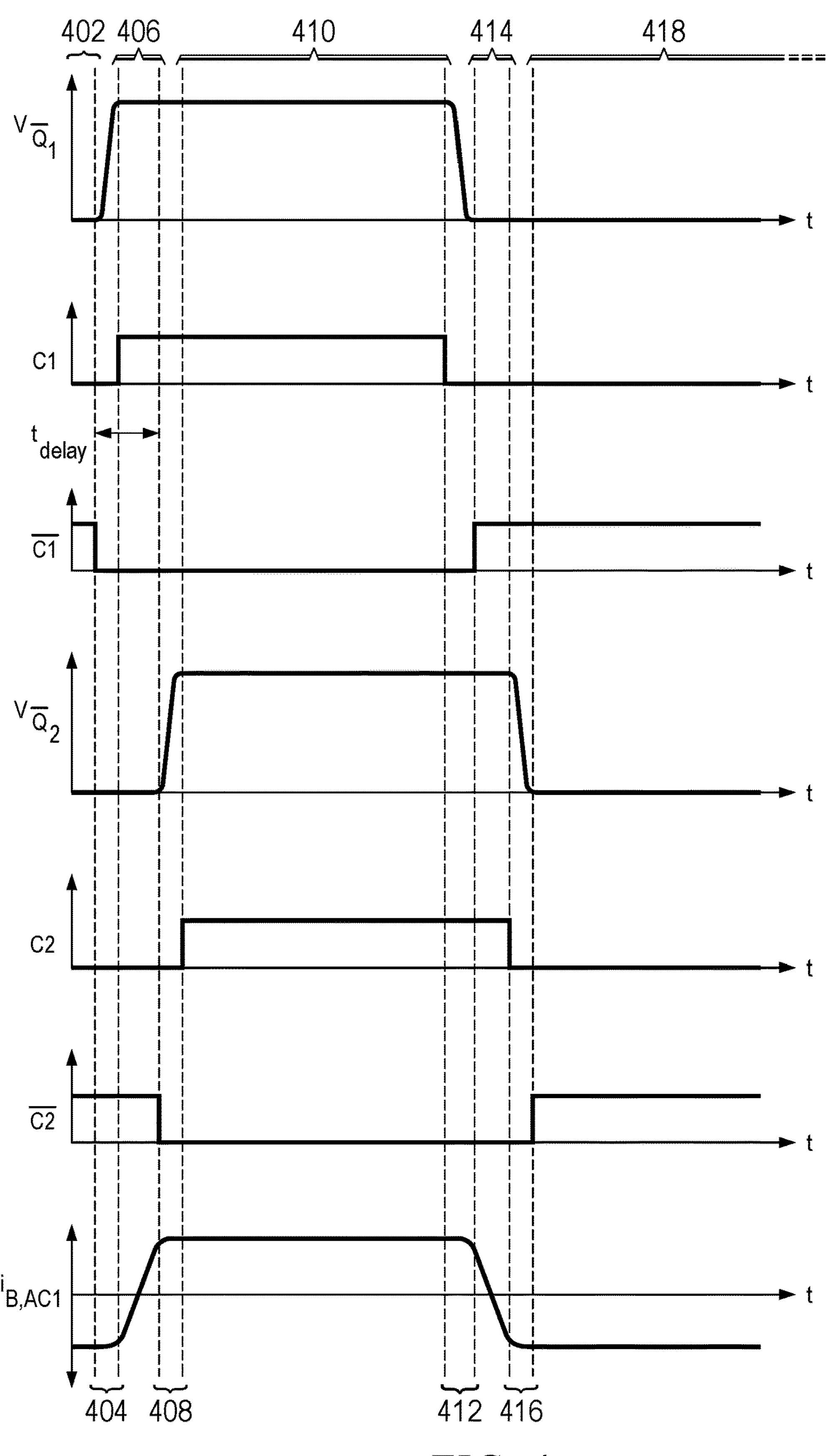
FIG. 4 is a graph of signals in the charge transfer circuit of FIG. 2.

FIG. 4 is a graph of signals in the charge transfer circuit 202 that illustrate transfer of charge from the DUT 104B to the DUT 104A during switching cycles of the half-bridge circuits 302 and 304. In the interval 402, the control circuit 308 provides $\overline{C1}$ and $\overline{C2}$ in a first state to turn on the transistors 310 and 314, and provides C1 and C2 in a second state to turn off the transistors 312 and 316. The voltage across the transistors 310 and 314 is zero or near zero. The current $i_{B,AC1}$ is negative.

In the interval 404, the control circuit 308 provides $\overline{C2}$ in the first state to turn on the transistor 314, and provides $\overline{C1}$, C1 and C2 in the second state ($\overline{C1}$ transitions from the second state to the first state) to turn off the transistors 310, 312, and 316. The transistor 312 can be turned off with zero voltage switching. The voltage ($V\overline{Q}_1$) across the transistor 310 increases.

In the interval 406, after the voltage across the transistor 310 has risen to a selected value, the control circuit 308 can provide C1 in the first state to turn on the transistor 312. Current $i_{B,AC1}$ flows through the transistor 312 due to the DUT voltage across the inductor 318. In this configuration, the transistors 310 and 316 are off, and the transistor 312 and transistor 314 are on to provide a path for current flow. The capacitor 320 can provide capacitive isolation between adjacent DUTs and can have a relatively low voltage tolerance (e.g., 5 Volt), as described above. The voltage across the capacitor 320 can be an average of the voltage v1 across the DUT 104B and the voltage v2 across the DUT 104A. The voltage across the inductor 318, which has opposite polarity from the voltage across the capacitor 320 (so that the total voltage is zero as switch nodes 334 and 332 are shorted together by transistors 314 and 312), causes the current flowing through the inductor 318 ($i_{B,AC1}$) to increase (ramps up), and the ramp rate can be determined by the inductance of the inductor 318. The duration of interval 406 can determine the amount of increase of the current before it stops increasing, and the amount of charge being transferred.

In the interval 408, after the current flowing to the inductor 318 has increased to a selected value, and the control circuit 308 can provide $\overline{C2}$ in the second state to turn off the transistor 314. In this configuration, the transistors 310, 314, and 316 are off, and the transistor 312 is on. The voltage ($V\overline{Q}_2$) across the transistor 314 increases.

In the interval 410, after the voltage across the transistor 314 has increased to a selected value, the control circuit 308 can provide C2 in the first state to turn on the transistor 316 with zero voltage switching. In this configuration, the transistors 310 and 314 are off, and the transistors 312 and 316 are on. The voltage across the inductor 318 is zero, and the current through the inductor ($i_{B,AC1}$) stays at (or near) the selected value. In the interval 410 (the power transfer interval), charge is transferred to the DUT 104A from the LC circuit 306. Accordingly, charge transferred from the DUT 104B to the LC circuit 306 is transferred to the DUT 104A.

In the interval 412, the control circuit 308 can provide C1 in the second state to turn off the transistor 312. The voltage ($V\overline{Q}_1$) across the transistor 310 falls.

In the interval 414, after the voltage across the transistor 310 has fallen to a selected value, the control circuit 308 can provide $\overline{C1}$ in the first state to turn on the transistor 310 with zero voltage switching. The current $i_{B,AC1}$ decreases and becomes negative.

In the interval 416, when the current flowing in the inductor 318 has fallen to a selected value, the control circuit 308 can provide C2 in the second state to turn off the transistor 316. The voltage ($V\overline{Q}_2$) across the transistor 314 falls.

In the interval 418, when the voltage across the transistor 314 has fallen to a selected value, the control circuit 308 can provide the $\overline{C2}$ in the first state to turn on the transistor 314 with zero voltage switching. In the interval 418, the charge transfer circuit 202 is in the same state as the interval 402 for execution of a successive charge transfer cycle.

In FIG. 4, the inductor 318 and the capacitor 320 can form a resonant circuit and support soft switching, and the switch nodes (332 and 334) can commutate without discharging capacitors 322, 324, 326, and 328. Such arrangements can speed up the switching and allow half-bridge circuits 302 and 304 to operate at a higher switching frequency, which in turn allows the devices of half-bridge circuits 302 and 304 to be made smaller. The increased switching frequency can also reduce the time for capacitor 320 to block a DC voltage, which can also reduce the size of capacitor 320.

While FIG. 4 illustrates transfer of charge from the DUT 104B to the DUT 104A, transfer of charge from the DUT 104A to the DUT 104B can be provided by swapping the timing of the signals C1 and $\overline{C1}$ in FIG. 4 with timing of the signals C2 and $\overline{C2}$ in FIG. 4.

The phase shift φ(in rad) between the control signals C1 and C2 is defined in terms of the switching frequency $f_{sw}$ and time delay ($t_{delay}$) between edges of C1 and C2 as:

$$\varphi = 2\pi t_{delay} f_{sw} \tag{1}$$

The relationship between the average current, I, over the switching cycle, the voltage, V, of the DUT, the switching frequency $f_{sw}$, the series inductance L of the inductor 318 and the phase shift φ is given by the following equation:

$$I = \frac{V\varphi}{8\pi L f_{sw}}\left(1 - \frac{\varphi}{\pi}\right) \tag{2}$$

When operating with relatively small φ, the equation can be simplified to:

$$I = \frac{V\varphi}{8\pi L f_{sw}} \tag{3}$$

Considering the maximum phase shift $\varphi_{max}$ (in radians) and the maximum time delay $t_{delay\_max}$, the switching frequency $f_{sw}$ can be written as:

$$f_{sw} = \frac{\varphi_{max}}{2\pi t_{delay\_max}} \tag{4}$$

Considering maximum current $I_{max}$, the voltage, V, of the DUT, switching frequency $f_{sw}$, and the maximum phase shift $\varphi_{max}$ (in radians), the series inductance L can be written as:

$$L = \frac{V\varphi_{max}}{8\pi f_{sw} I_{max}}\left(1 - \frac{\varphi_{max}}{\pi}\right) \tag{5}$$

The capacitance of the capacitor 320 can be selected to ensure inductive operation of the LC circuit 306 by setting the resonant frequency much smaller than the switching frequency $f_{sw}$. In order to reduce the size of the capacitor 320, a maximum resonant frequency can be selected by choosing a factor of 5 between the resonant frequency and the switching frequency $f_{sw}$ as follows:

$$\frac{1}{2\pi\sqrt{LC}} = \frac{1}{5} f_{sw} \tag{6}$$

Figure 5:
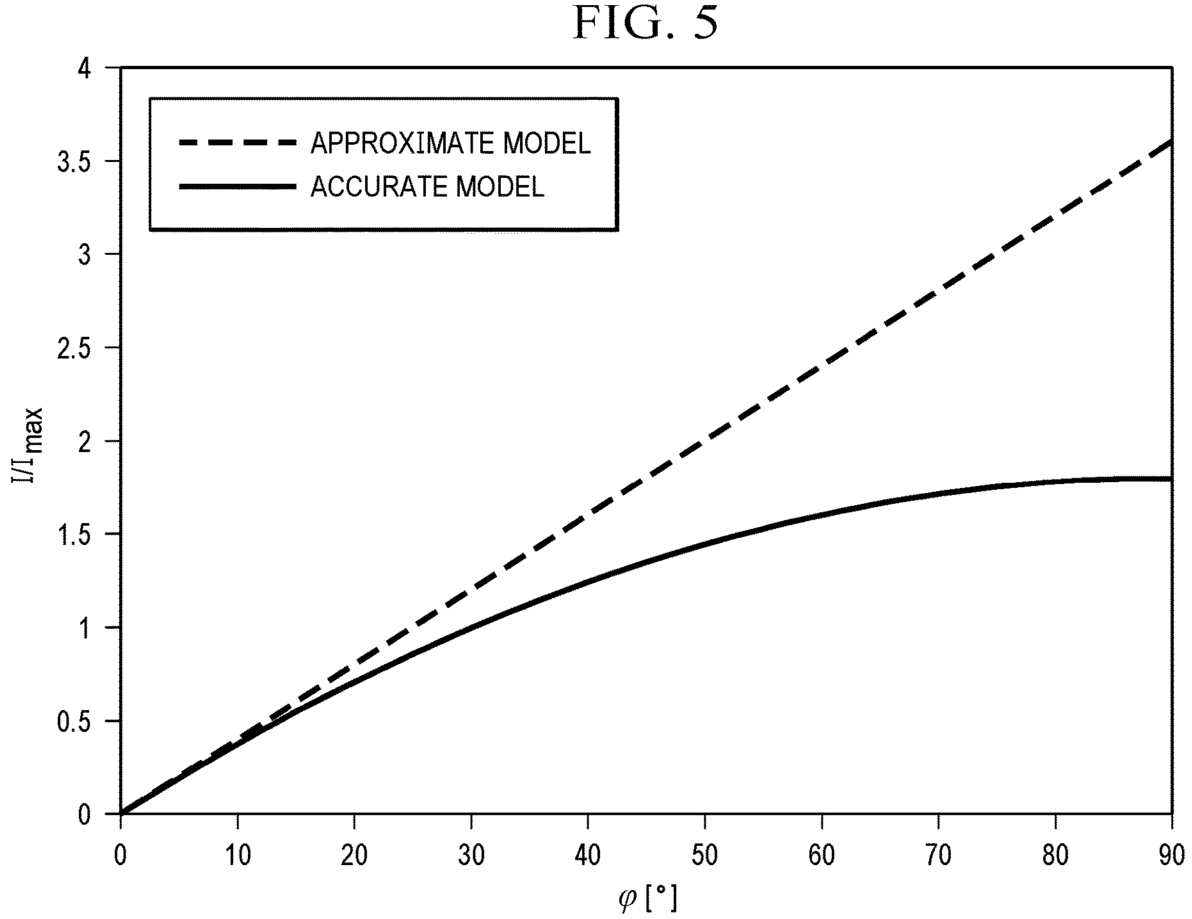
FIG. 5 is a graph of normalized current versus phase shift in the charge transfer circuit of FIG. 3.

FIG. 5 is a graph of normalized current versus phase shift in the charge transfer circuit 202. FIG. 5 shows current/normalized to the maximum current $I_{max}$ vs phase shift φ shown in degrees. For lower values of φ, the relationship between the phase shift and the current is fairly linear. For larger values of the phase shift, the linear approximation can result in a significant error. For the example of FIG. 5, maximum phase shift can be selected to be $$\varphi_{max} = \frac{\pi}{6} \text{(i.e., 30°)}.$$

Figure 6:
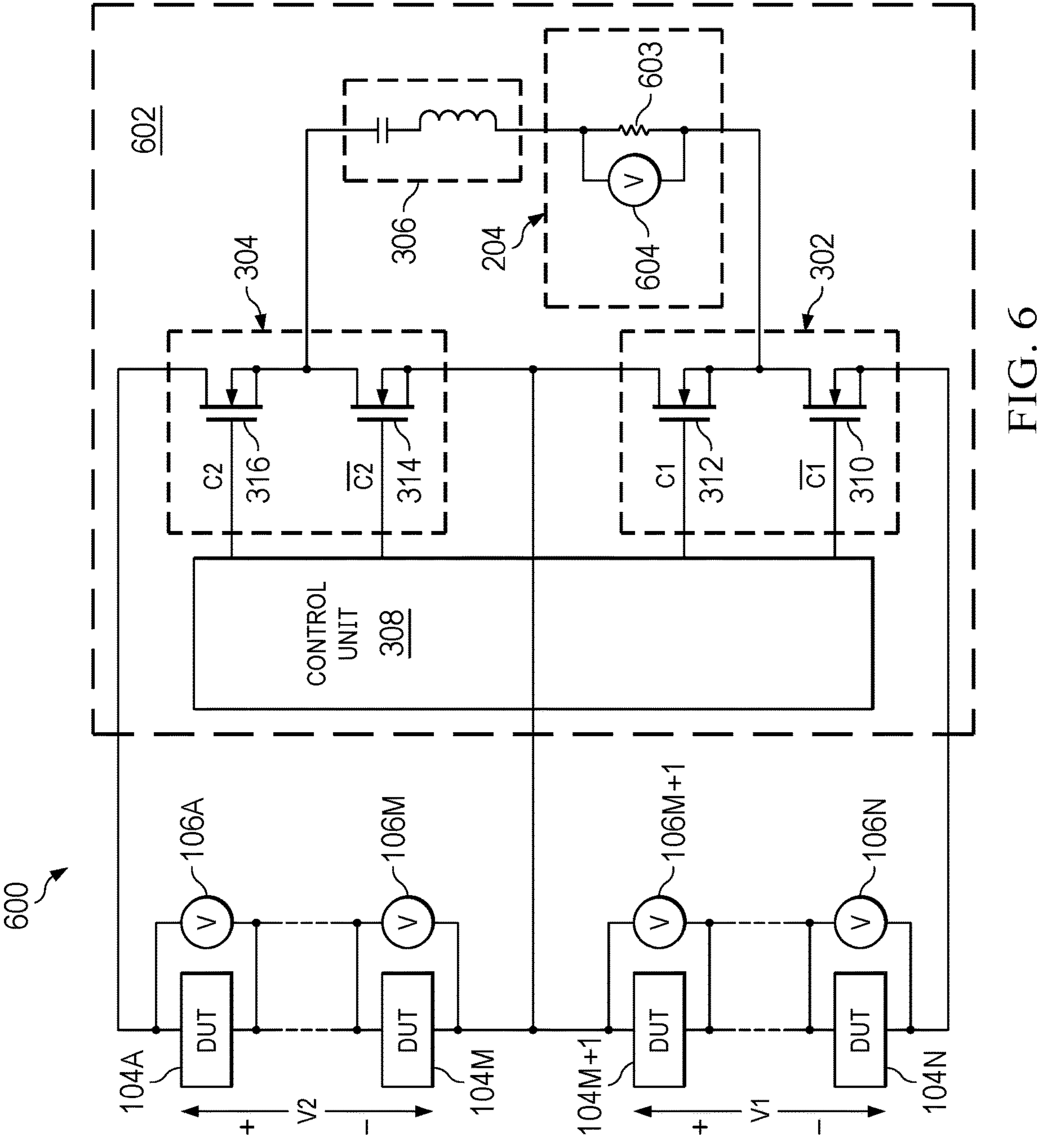
FIG. 6 is a block diagram of an example system for determining an attribute of devices under test using transfer of charge between the devices under test.

FIG. 6 is a block diagram of an example system 600 for determining an attributes of a device under test using transfer of charge between the devices under test. The system 600 includes a charge transfer circuit 602, DUTs 104A-104N (DUTS 104A, 104M, 104M+1, and 104N are shown), and voltage sensors 106A-106N (voltage sensors 106A, 106M, 106M+1, and 106N are shown). One of the voltage sensors 106 is coupled across each DUT 104 to measure the voltage thereof.

The charge transfer circuit 602 is similar to the charge transfer circuit 202 shown in FIG. 3, and includes the half-bridge circuit 302, the half-bridge circuit 304, the LC circuit 306, and the control circuit 308. The charge transfer circuit 602 also includes a current sense resistor 603 coupled in series with the LC circuit 306, and a voltage sensor 604 coupled across the current sense resistor 603. The current sense resistor 603 and the voltage sensor 604 form the current sensor 204 shown in FIG. 2.

The half-bridge circuit 302 is coupled across a first set of the DUTs 104 including the DUTs 104M+1 through 104N. The half-bridge circuit 304 is coupled across a second set of the DUTs 104 including the DUTs 104A through 104M. The charge transfer circuit 602 can draw an excitation current from the first set of the DUTs and transfers the charge to the second set of the DUTs. The charge transfer circuit 602 can also draw an excitation current from the second set of the DUTs and transfers the charge to the first set of the DUTs.

The current sense resistor 603 and the voltage sensor 604 measure the excitation current drawn from the DUTs, and the voltage sensors 106A-106N measure the voltages of the DUTs 104A through 104N. The voltage and current measurement signals can be provided to the processing circuit 110 and used by the processing circuit 110 to compute impedance values of the DUTs 104A through 104N.

Figure 7A:
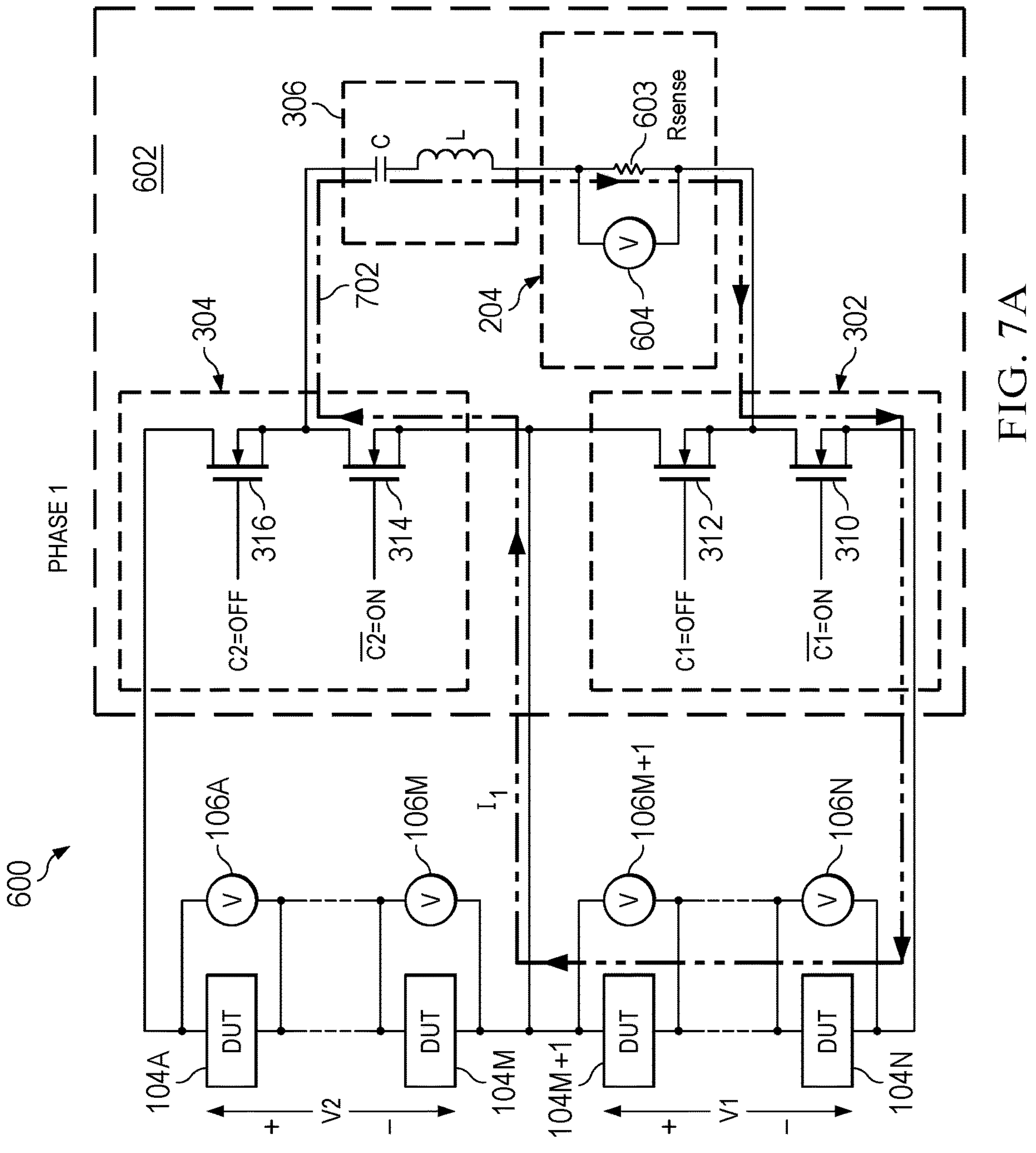
FIGS. 7A and 7B are schematics of a system showing example current flow for generating an excitation current by transferring charge between two devices under test.
Figure 7B:
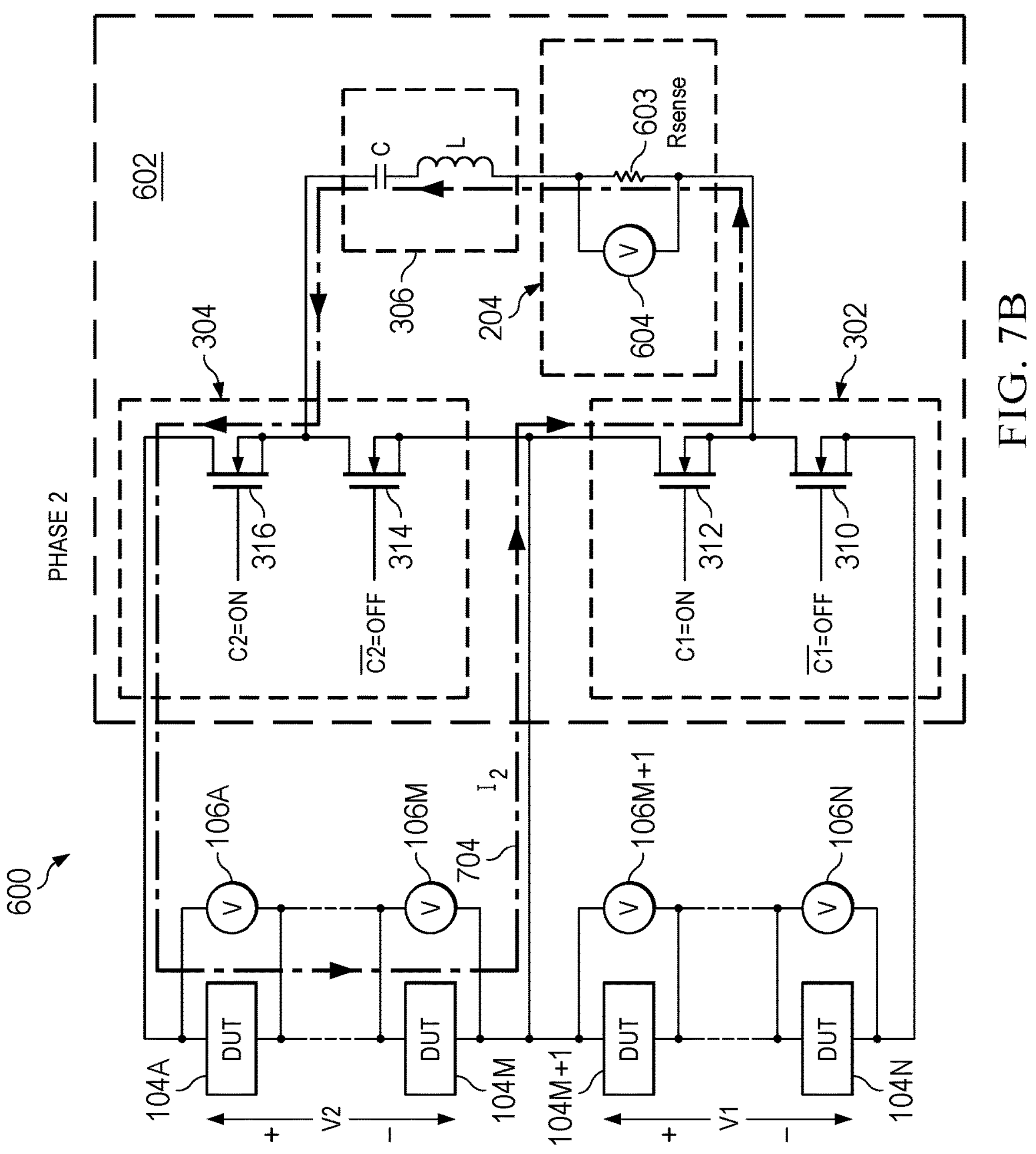

FIGS. 7A and 7B are schematics of the system 600 showing transfer of charge from the first set of DUTs to the second set of DUTs. In FIG. 7A, the transistor 310 and the transistor 314 are on, and the transistor 312 and the transistor 316 are off, causing current to flow from the DUTs 104M+1 through 104N in the path 702. The charge drawn from the DUTs 104M+1 through 104N is stored in the LC circuit 306. No current flows through the DUTs 104A through 104M in FIG. 7A. The current sense resistor 603 and the voltage sensor 604 measure the current drawn from the DUTs 104M+1 through 104N. The voltage sensors 106M+1 through 106N measure the voltage across the DUTs 104M+1 through 104N.

In FIG. 7B, the transistor 310 and the transistor 314 are off, and the transistor 312 and the transistor 316 are on, causing charge stored in the LC circuit 306 to be transferred from the LC circuit 306 to the DUTs 104A-104M in the path 704. No current flows through the DUTs 104M+1 through 104N in FIG. 7B.

Figure 8:
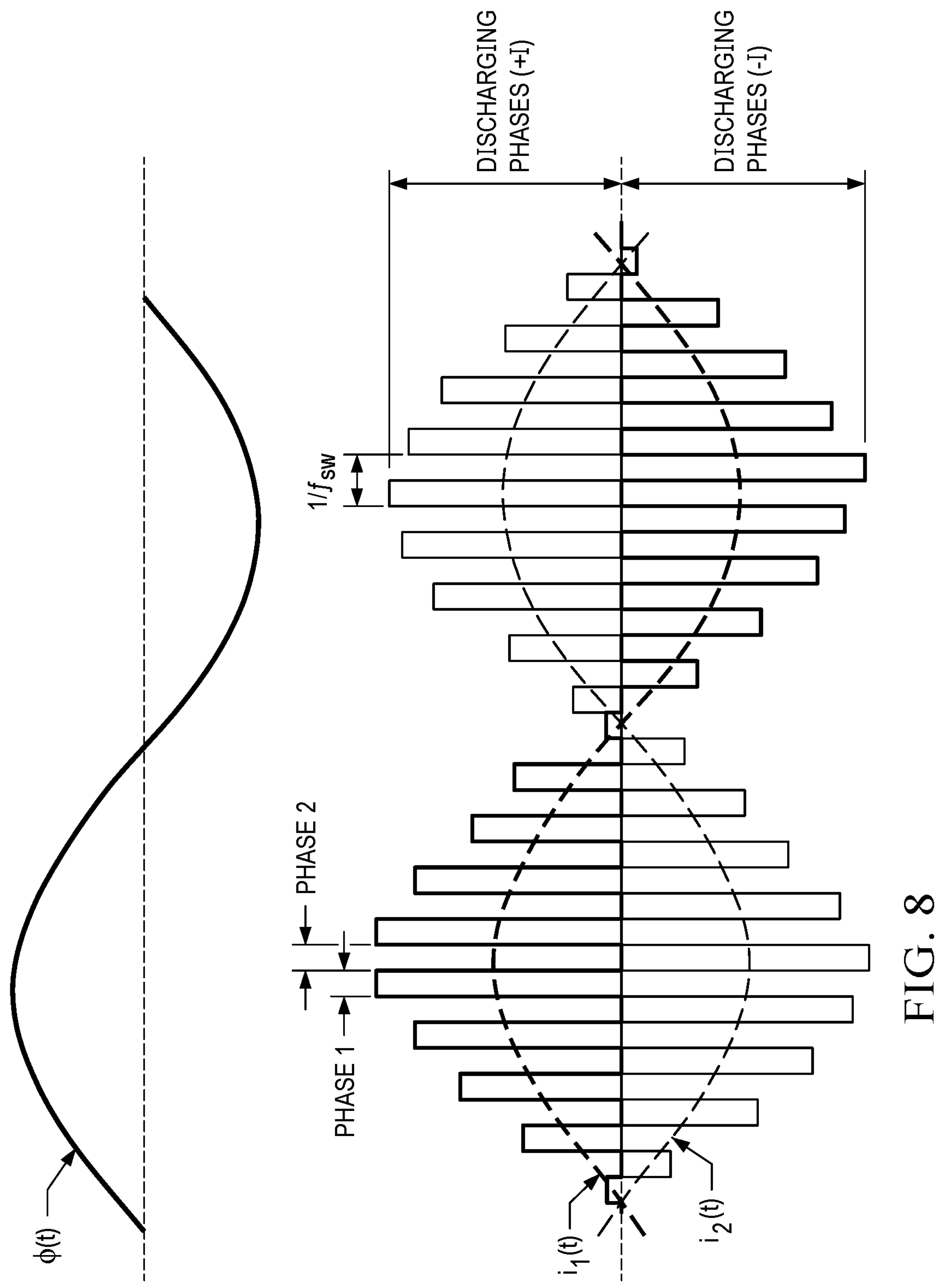
FIG. 8 is a graph of example current flow in charge and discharge phases during excitation current generation in the circuit of FIGS. 7A and 7B.

FIG. 8 is a graph of example current flow in the circuit of FIGS. 7A and 7B. In FIG. 8, $i_1(t)$ is the current flow in phase 1 shown in FIG. 7A, $i_2(t)$ is the current flow in phase 2 shown in FIG. 7B, and φ(t) is relative phase of the control signals C1 and C2. The amplitude of the current of each switching cycle (switching of C1, C2, and) is controlled by the phase φ(t) according to a desired sinusoidal excitation shown in FIG. 8. The φ(t) can be positive or negative by lagging or leading the control signals of the half-bridge circuit 304 relative to the half-bridge circuit 302. Therefore, the excitation signal can be centered around zero without DC current to reduce power loss. The polarity of the amplitude of the excitation signal determines the polarity of φ(t) which controls the charging and discharging phases for the DUTs as shown in FIGS. 7A and 7B. The average current in each set of DUTs, which can be determined using a low-pass filter to remove the high-frequency switching components, can be equal to the desired sinusoidal excitation waveform through the DUTs.

Figure 9A:
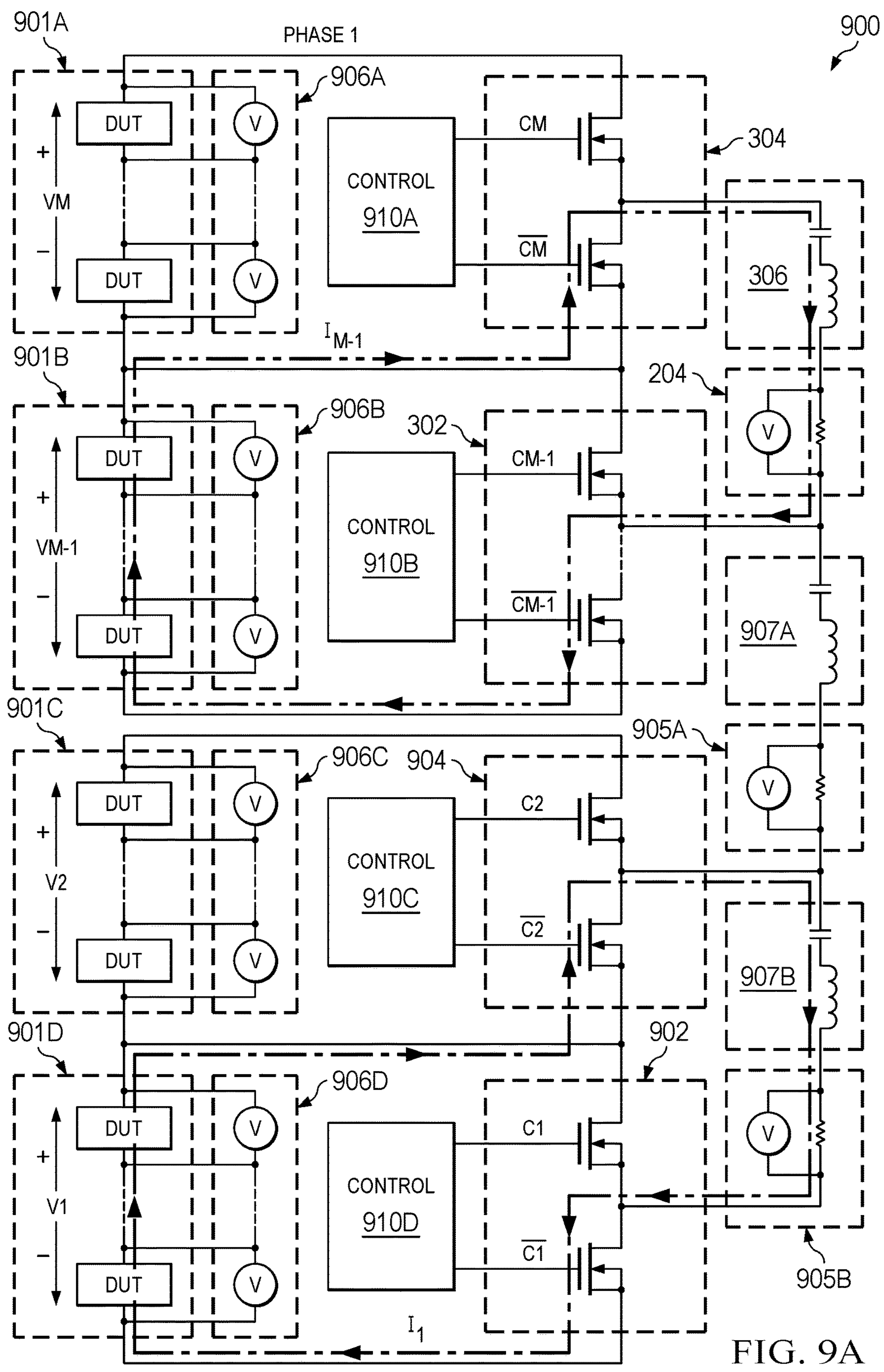
FIGS. 9A and 9B are schematics of a system showing example current flow for generating an excitation current by transferring charge between multiple modules.
Figure 9B:
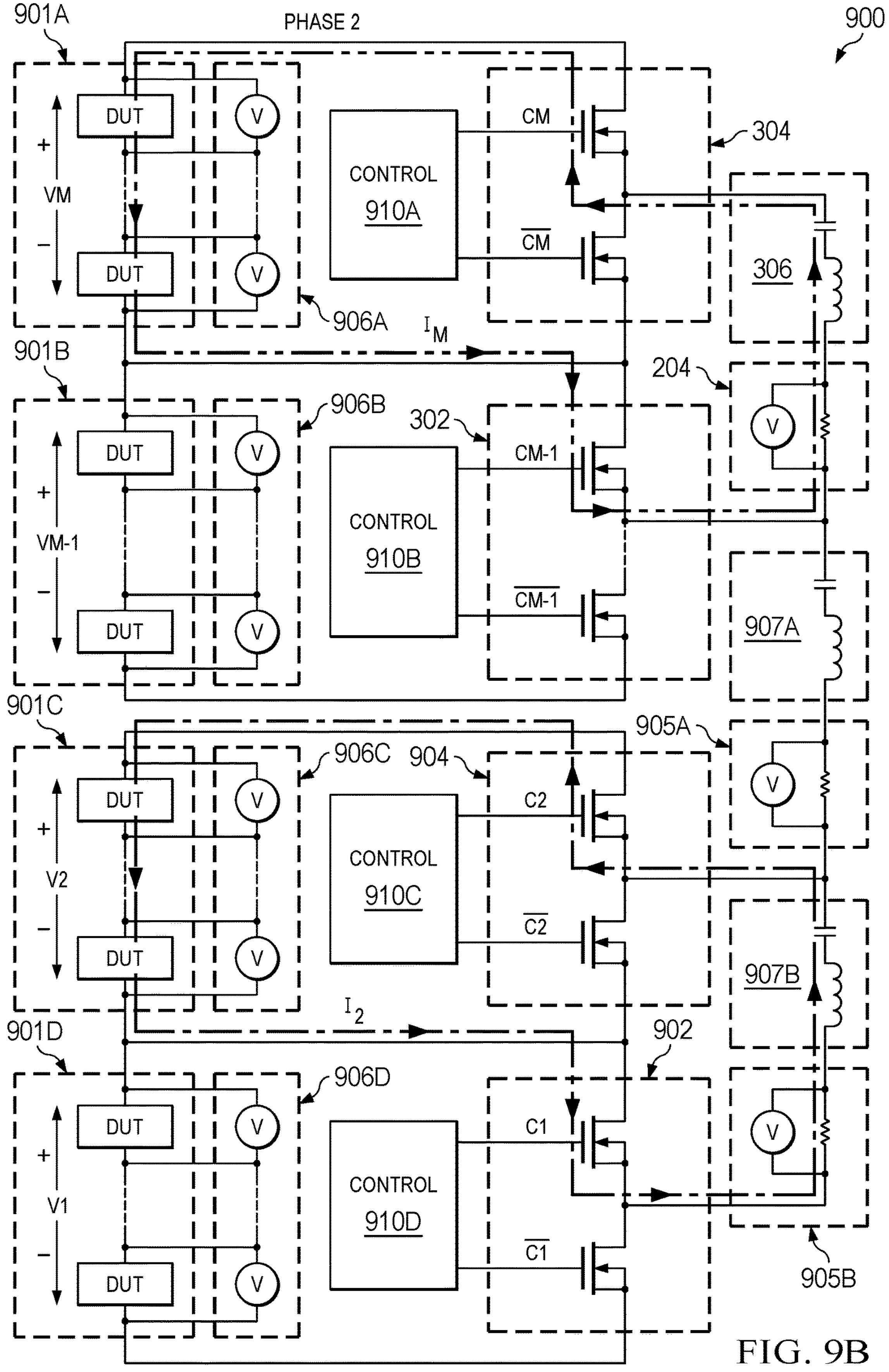

FIGS. 9A and 9B are schematics of a system 900 for generating an excitation current by transferring charge between multiple modules under test (MUTs). The system 900 includes MUTs 901A, 901B, 901C, and 901D, each of which can include multiple DUTs coupled in series as a battery pack. The MUTs 901A, 901B, 901C, and 901D are coupled in series. A DUT can be a battery cell, and a module under test can be a battery module. The system 900 includes voltage sensors 906A, 906B, 906C, and 906D. The voltage sensors 906A include a voltage sensor coupled across each DUT of the MUT 901A. The voltage sensors 906B include a voltage sensor coupled across each DUT of the MUT 901B. The voltage sensors 906C include a voltage sensor coupled across each DUT of the MUT 901C. The voltage sensors 906D include a voltage sensor coupled across each DUT of the MUT 901D. Voltage sensor connections to the DUTs can be Kelvin connections.

The system 900 includes the half-bridge circuit 304 coupled across the MUT 901A, the half-bridge circuit 302 coupled across the MUT 901B, a half-bridge circuit 904 coupled across the MUT 901C, and a half-bridge circuit 902 coupled across the MUT 901D. The LC circuit 306 is coupled between the half-bridge circuit 302 and the half-bridge circuit 304 to store charge transferred between the MUT 901A and the MUT 901B. The LC circuit 907A is coupled between the half-bridge circuit 904 and the half-bridge circuit 302 to store charge transferred between the MUT 901C and the MUT 901B. The LC circuit 907B is coupled between the half-bridge circuit 902 and the half-bridge circuit 904 to store charge transferred between the MUT 901D and the MUT 901C.

The current sensor 204 is coupled between the LC circuit 306 and the half-bridge circuit 302 to measure current flowing between the MUT 901A and the MUT 901B. The current sensor 905A is coupled between the LC circuit 907A and the half-bridge circuit 904 to measure current flow between the MUT 901B and the MUT 901C. The current sensor 905B is coupled between the LC circuit 907B and the half-bridge circuit 902 to measure current flow between the MUT 901C and the MUT 901D.

The control circuits 910A, 910B, 910C, and 910D are respectively coupled to the half-bridge circuits 304, 302, 904, and 902 to control the switching of the transistors in the half-bridge circuits. The control circuits 910A, 910B, 910C, and 910D may be provided as a single control circuit or as separate control circuits (as shown in FIGS. 9A and 9B).

In FIG. 9A, the control circuits 910A, 910B, 910C, and 910D have configured the half-bridge circuits 304, 302, 904, and 902 to draw excitation current from the MUT 901D and store charge in the LC circuit 907B, and to draw excitation current from the MUT 901B and store charge in the LC circuit 306. In FIG. 9B, the control circuits 910A, 910B, 910C, and 910D have configured the half-bridge circuits 304, 302, 904, and 902 to transfer charge from the LC circuit 306 to the MUT 901A, and to transfer charge from the LC circuit 907B to the MUT 901C. The transistors of the half-bridge circuits are controlled as described with regard to FIGS. 7A and 7B to perform the charge transfers. In some examples, LC circuits 306, 907A, and 907B can be replaced by other LC networks, such as those shown in related U.S. patent application Ser. Nos. 18/340,399 and 18/340,476.

Figure 10:
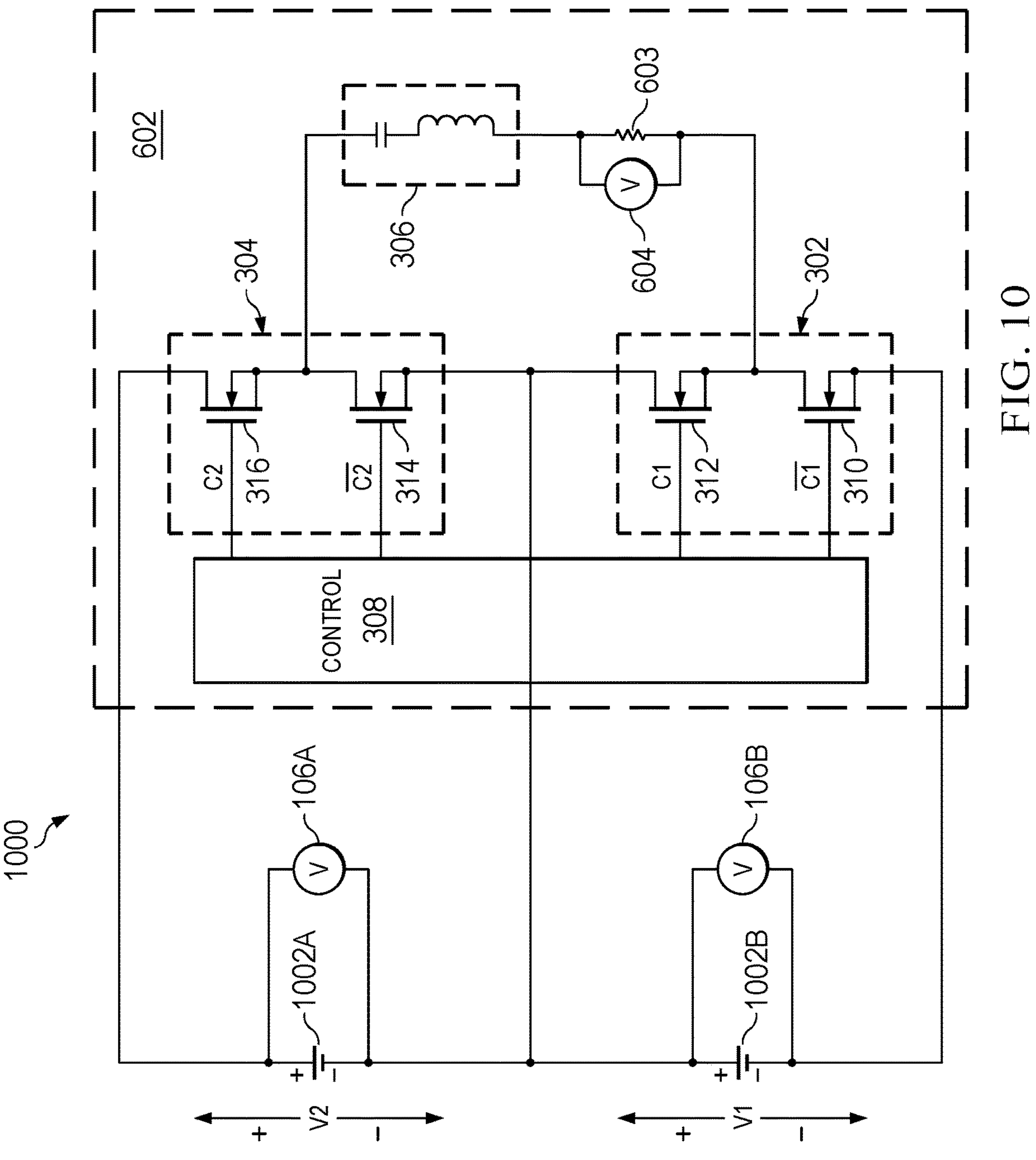
FIG. 10 is a schematic of an example circuit for generating excitation current by charge transfer between two battery cells.

FIG. 10 is a schematic of an example circuit 1000 for generating excitation current by charge transfer between two battery cells. The circuit 1000 includes battery cells 1002A and 1002B, a charge transfer circuit 602, and voltage sensors 106A and 106B. The voltage sensor 106A is coupled by Kelvin connection across the battery cell 1002A to measure the voltage thereof. The voltage sensor 106B is coupled by Kelvin connection across the battery cell 1002B to measure the voltage thereof.

The charge transfer circuit 602 is similar to the charge transfer circuit 202 shown in FIG. 3, and includes the half-bridge circuit 302, the half-bridge circuit 304, the LC circuit 306, and the control circuit 308. The charge transfer circuit 602 also includes a current sense resistor 603 coupled in series with the LC circuit 306, and a voltage sensor 604 coupled across the current sense resistor 603. The current sense resistor 603 and the voltage sensor 604 form the current sensor 204 shown in FIG. 2. Switching of the half-bridge circuit 302 and the half-bridge circuit 304 are controlled by the control circuit 308 to draw an excitation current from one of the battery cells 1002A and 1002B and store charge in the LC circuit 306, and then transfer the charge stored in the LC circuit 306 to the other of the battery cells 1002A and 1002B.

The half-bridge circuit 302 is coupled across the battery cell 1002B. The half-bridge circuit 304 is coupled across the battery cell 1002A. In one example, the control circuit 308 causes the charge transfer circuit 602 to draw an excitation current from the battery cell 1002B and store the charge in the LC circuit 306. Thereafter, the control circuit 308 causes the charge transfer circuit 602 to transfer the charge stored in the LC circuit 306 to the battery cell 1002A. In another example, the control circuit 308 causes the charge transfer circuit 602 to draw an excitation current from the battery cell 1002A and store the charge in the LC circuit 306. Thereafter, the control circuit 308 causes the charge transfer circuit 602 to transfer the charge stored in the LC circuit 306 to the battery cell 1002B.

The current sense resistor 603 and the voltage sensor 604 measure the excitation current drawn from the battery cell 1002A and the battery cell 1002B, and the voltage sensors 106A and 106B measure the voltages of the battery cell 1002A and the battery cell 1002B. The voltage and current measurement signals can be provided to the processing circuit 110 and used by the processing circuit 110 to compute impedance values of the battery cells 1002A and 1002B.

Figure 11:
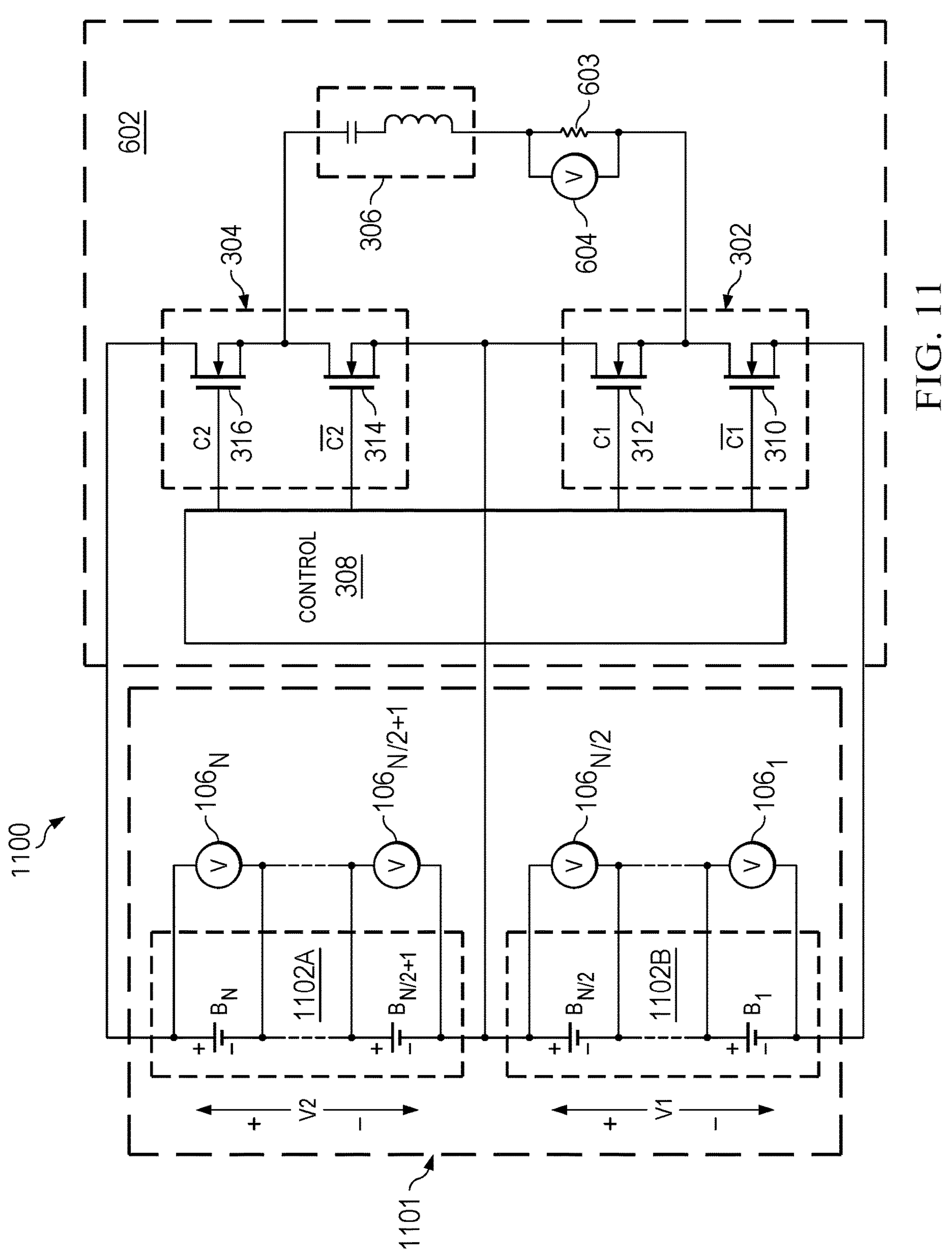
FIG. 11 is a schematic of an example circuit for generating excitation current by charge transfer between battery cells of a battery module.

FIG. 11 is a schematic of an example circuit 1100 for generating excitation current by charge transfer between battery cells of a battery module. The circuit 1100 includes a battery module 1101. The battery module 1101 includes multiple battery cells $B_1$-$B_N$. The battery cells of the battery module 1101 are subdivided into a submodule 1102A, which can include a first half of the battery cells of the battery module 1101, and submodule 1102B, which can include a second half of the battery cells of the battery module 1101. The circuit 1100 also includes the charge transfer circuit 602, and voltage sensors $\mathbf{106}_1$-$\mathbf{106}_N$ (voltages sensors $\mathbf{106}_1$, $\mathbf{106}_{N/2}$, $\mathbf{106}_{N/2+1}$, and $\mathbf{106}_N$ are shown in FIG. 11). One of the voltage sensors is coupled by Kelvin connection across each of the batteries of the battery module 1101 to measure the voltage thereof.

The charge transfer circuit 602 is similar to the charge transfer circuit 202 shown in FIG. 3, and includes the half-bridge circuit 302, the half-bridge circuit 304, the LC circuit 306, and the control circuit 308. The charge transfer circuit 602 also includes a current sense resistor 603 coupled in series with the LC circuit 306, and a voltage sensor 604 coupled across the current sense resistor 603. The current sense resistor 603 and the voltage sensor 604 form the current sensor 204 shown in FIG. 2. Switching of the half-bridge circuit 302 and the half-bridge circuit 304 are controlled by the control circuit 308 to draw an excitation current from one of the submodules 1102A and 1102B and store charge in the LC circuit 306, and then transfer the charge stored in the LC circuit 306 to the other of the submodules 1102A and 1102B.

The half-bridge circuit 302 is coupled across the submodule 1102B. The half-bridge circuit 304 is coupled across the submodule 1102A. In one example, the control circuit 308 causes the charge transfer circuit 602 to draw an excitation current from the submodule 1102B and store the charge in the LC circuit 306. Thereafter, the control circuit 308 causes the charge transfer circuit 602 to transfer the charge stored in the LC circuit 306 to the submodule 1102A. In another example, the control circuit 308 causes the charge transfer circuit 602 to draw an excitation current from the submodule 1102A and store the charge in the LC circuit 306. Thereafter, the control circuit 308 causes the charge transfer circuit 602 to transfer the charge stored in the LC circuit 306 to the submodule 1102B.

The current sense resistor 603 and the voltage sensor 604 measure the excitation current drawn from the submodule 1102A and the submodule 1102B, and the voltage sensors $\mathbf{106}_1$-$\mathbf{106}_N$ measure the voltages of the batteries $B_1$-$B_N$. The voltage and current measurement signals can be provided to the processing circuit 110 and used by the processing circuit 110 to compute impedance values of the battery cells of the battery module 1101.

Figure 12:
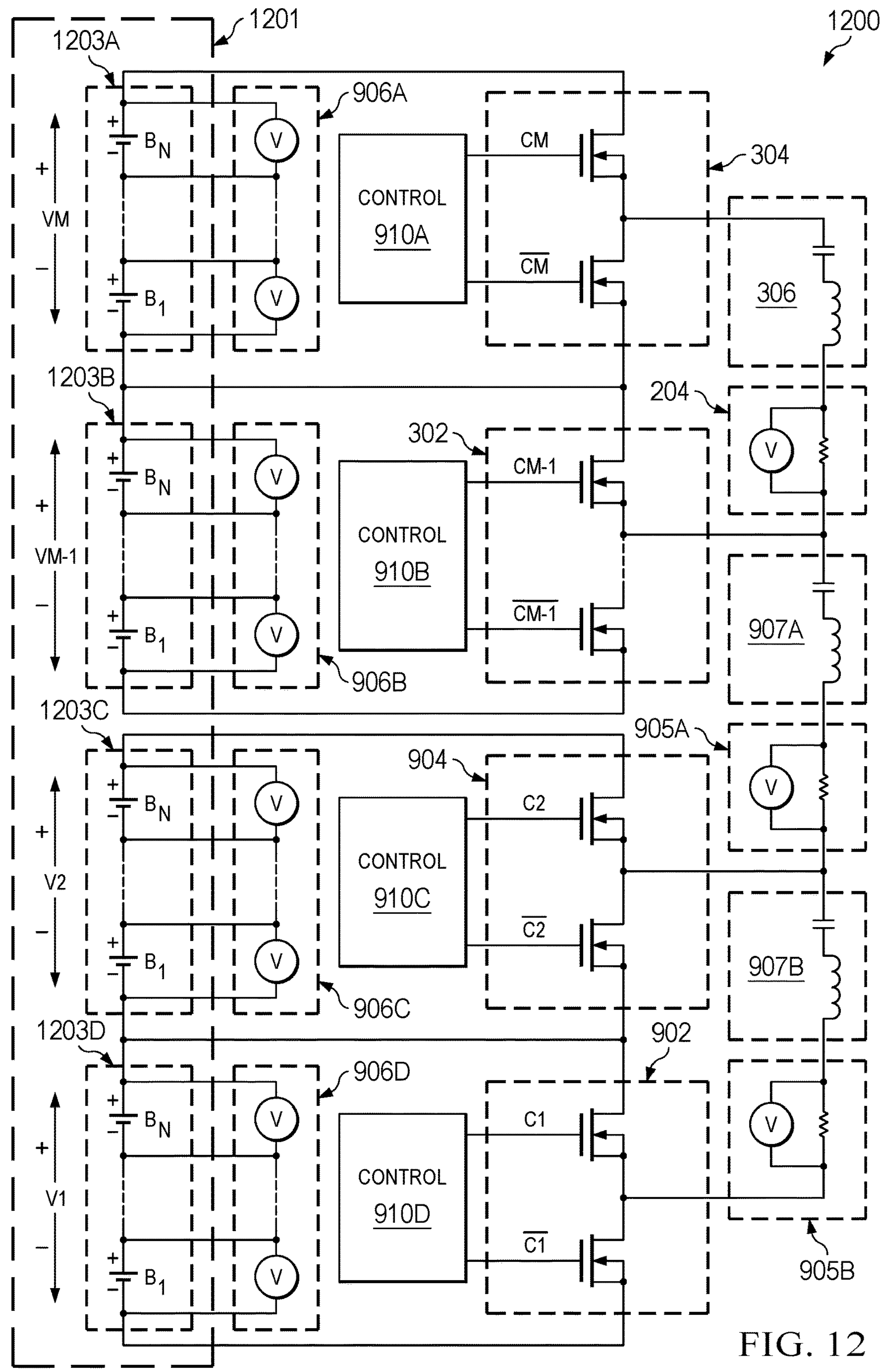
FIG. 12 is a schematic of an example system for generating an excitation current by transferring charge between battery modules using half-bridge circuits.

FIG. 12 is a schematic of a system 1200 for generating an excitation current by transferring charge between battery modules using half-bridge circuits. The system 1200 includes a battery pack 1201 that includes battery modules 1203A, 1203B, 1203C, and 1203D coupled in series. Each of the battery modules can include multiple batteries ($B_1$-$B_N$) coupled in series. The system 1200 includes voltage sensors 906A, 906B, 906C, and 906D. The voltage sensors 906A include a voltage sensor coupled across each battery of the battery module 1203A. The voltage sensors 906B include a voltage sensor coupled across each battery of the battery module 1203B. The voltage sensors 906C include a voltage sensor coupled across each battery of the battery module 1203C. The voltage sensors 906D includes a voltage sensor coupled across each battery of the battery module 1203D. Voltage sensor connections to the batteries can be Kelvin connections.

The system 1200 includes the half-bridge circuit 304 coupled across the battery module 1203A, the half-bridge circuit 302 coupled across the battery module 1203B, a half-bridge circuit 904 coupled across the battery module 1203C, and a half-bridge circuit 902 coupled across the battery module 1203D. The LC circuit 306 is coupled between the half-bridge circuit 302 and the half-bridge circuit 304 to store charge transferred between the battery module 1203A and the battery module 1203B. The LC circuit 907A is coupled between the half-bridge circuit 904 and the half-bridge circuit 302 to store charge transferred between the battery module 1203C and the battery module 1203B. The LC circuit 907B is coupled between the half-bridge circuit 902 and the half-bridge circuit 904 to store charge transferred between the battery module 1203D and the battery module 1203C.

The current sensor 204 is coupled between the LC circuit 306 and the half-bridge circuit 302 to measure current flowing between the battery module 1203A and the battery module 1203B. The current sensor 905A is coupled between the LC circuit 907A and the half-bridge circuit 904 to measure current flow between the battery module 1203B and the battery module 1203C. The current sensor 905B is coupled between the LC circuit 907B and the half-bridge circuit 902 to measure current flow between the battery module 1203C and the battery module 1203D.

The control circuits 910A, 910B, 910C, and 910D are respectively coupled to the half-bridge circuits 304, 302, 904, and 902 to control the switching of the transistors in the half-bridge circuits. The control circuits 910A, 910B, 910C, and 910D may be provided as a single control circuit or as separate control circuits (as shown in FIG. 12).

In various examples of the system 1200, charge may be transferred between adjacent battery modules (e.g., between the battery module 1203A and the battery module 1203B, between the battery module 1203B and the battery module 1203C, between the battery module 1203C and the battery module 1203D), or between non-adjacent battery modules to provide an excitation current for use in EIS determination. Current and voltage measurement signals provided by the current and voltage sensors of the system 1200 can be provided to the processing circuit 110 for use in EIS computation.

Figure 13:
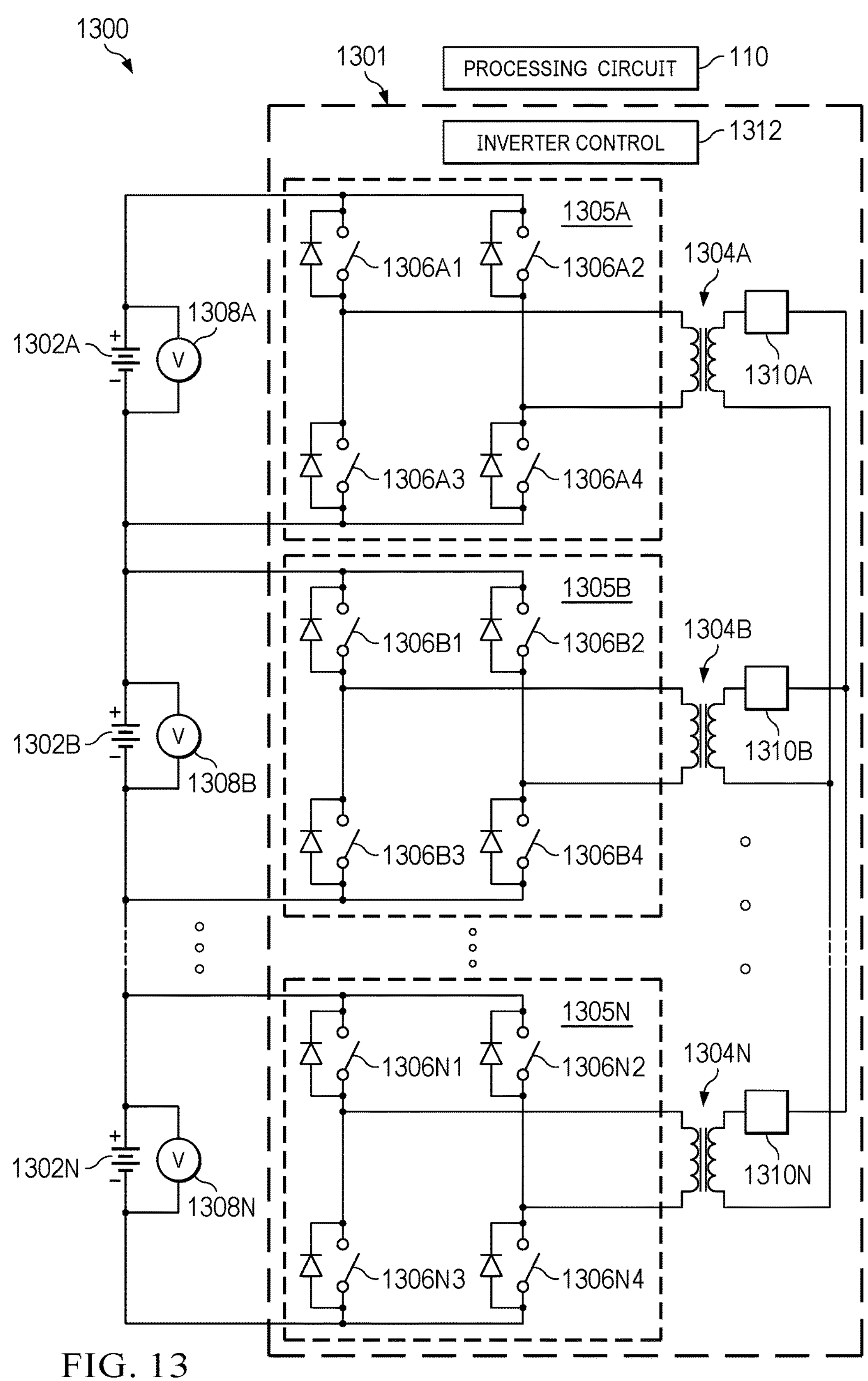
FIG. 13 is a schematic of an example system for generating an excitation current by transferring charge between batteries using transformers.

FIG. 13 is a schematic of a system 1300 for generating an excitation current by transferring charge between batteries using transformers. The system 1300 includes batteries 1302A-1302N (batteries 1302A, 1302B, and 1302N are shown), a charge transfer circuit 1301, voltage sensors 1308A-1308N (voltages sensors 1308A, 1308B, and 1308N are shown), and the processing circuit 110. The charge transfer circuit 1301 includes transformers 1304A-1304N (transformers 1304A, 1304B, and 1304N are shown), inverter circuits 1305A-1305N (inverter circuits 1305A, 1305B, and 1305N are shown), current sensors 1310A-1310N (current sensors 1310A, 1310B, and 1310N are shown), and an inverter control circuit 1312.

The voltage sensors 1308A, 1308B, and 1308N are respectively coupled across the batteries 1302A, 1302B, and 1302N to measure the voltage thereof. A battery is also coupled between the first and second terminals of each inverter circuit. The battery 1302A is coupled between the first and second terminals of the inverter circuit 1305A. The battery 1302B is coupled between the first and second terminals of the inverter circuit 1305B. The battery 1302N is coupled between the first and second terminal of the inverter circuit 1305N. Each inverter circuit includes switches coupled as a full bridge. The switches can be implemented using transistors. The inverter circuit 1305A includes switches 1306A1, 1306A2, 1306A3, and 1306A4 connected as a full bridge. The inverter circuit 1305B includes switches 1306B1, 1306B2, 1306B3, and 1306B4 connected as a full bridge. The inverter circuit 1305N includes switches 1306N1, 1306N2, 1306N3, and 1306N4 connected as a full bridge.

The transformers 1304A-1304N are coupled to third and fourth terminals of the inverter circuits. The primary coil of the transformer 1304A is coupled between the third and fourth terminals of the inverter circuit 1305A. The primary coil of the transformer 1304B is coupled between the third and fourth terminals of the inverter circuit 1305B. The primary coil of the transformer 1304N is coupled between the third and fourth terminals of the inverter circuit 1305N. The secondary coil of each transformer is coupled to the secondary coil of each other transformer. By varying the voltage across the primary coil, the transformer can move charge from one of batteries 1302A-1302N during an EIS measurement and induce a voltage and current in the secondary coil via electromagnetic inductance. The induced voltage and current on the secondary coil, which depends on the winding ratio of the transformer, provide an induced charge to another one of batteries 1302A-1302N, which minimizes the power loss of the EIS measurement.

The inverter control circuit 1312 controls the switching of the switches in each of the inverter circuits. For example, an output of the inverter control circuit 1312 is coupled to a control terminal of each switch of each inverter circuit. The inverter control circuit 1312 may control the switching of selected one of the inverter circuits to draw an excitation current from the battery coupled to the inverter circuit. For example, the inverter control circuit 1312 may control (pulse width modulate) the switching of the inverter circuit 1305A to draw sinusoidal current of one or more frequencies from the battery 1302A. The inverter control circuit 1312 may control the switching of the inverter circuit 1305B or the inverter circuit 1305N to transfer the charge drawn from the battery 1302A to the battery 1302B or the battery 1302N. The current sensors 1310A, 1310B, and/or 1310C measure the excitation current, and the voltage sensors 1308A, 1308B, and/or 1308N measure the voltage across the battery from which current is being drawn, and provide current and voltage measurement signals to the processing circuit 110. The processing circuit 110 can compute the impedance of the battery based on the current and voltage measurement signals.

Figure 14:
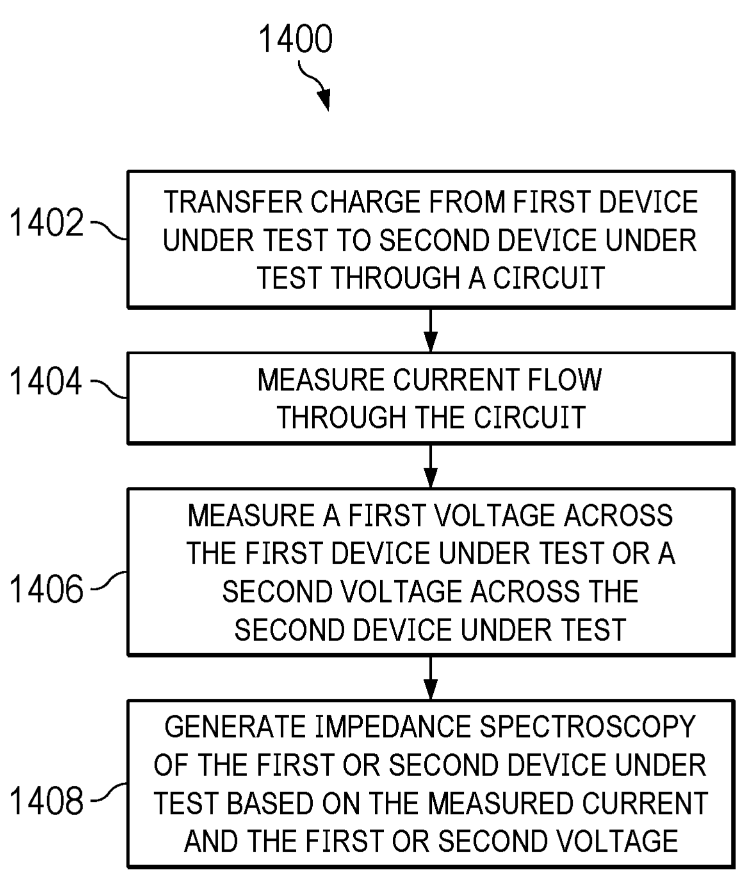
FIG. 14 is a flow diagram for an example method of Electrochemical Impedance Spectroscopy that generates an excitation current by transferring charge between devices under test.

FIG. 14 is a flow diagram for an example method 1400 of EIS that generates an excitation current by transferring charge between devices under test. Though depicted sequentially as a matter of convenience, at least some of the actions shown can be performed in a different order and/or performed in parallel. Additionally, some implementations may perform only some of the actions shown. Operations of the method 1400 may be performed by the system 200, the system 600, the system 900, the circuit 1000, the circuit 1100, the system 1200, the system 1300, etc.

In block 1402, charge is transferred from a first DUT to a second DUT through a circuit. The DUTs can be electrochemical battery cells, batteries made up of multiple battery cells, or other energy storage devices such as super capacitors. The circuit can be the charge transfer circuit 202, the charge transfer circuit 602, or other half-bridge switching based charge transfer circuit, or the circuit can be the 1301 or similar transformer based charge transfer circuit. Transferring the charge can include transferring the charge from the first DUT to an energy storage device (e.g., the LC circuit 306), and thereafter transferring the charge stored in the energy storage device to the second DUT.

In block 1404, the current flowing during the transfer of charge in block 1402 is measured. For example, the current sensor 204 or the current sensor 1310A can measure the current flowing during the charge transfer.

In block 1406, a voltage across the first DUT and/or a voltage across the second DUT is measured. For example, the voltage sensors 106A, 106M, 106M+1, 106N, 1308A, or 1308B can measure the voltage across the DUT coupled between the terminals of the voltage sensor.

In block 1408, the processing circuit 110 generates impedance spectroscopy of the first DUT or the second DUT based on the current measured in block 1404 and the voltage measured in block 1406.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET), or a p-channel FET (PFET)), a n-type metal-oxide semiconductor field-effect transistors (nMOSFET or just "nMOS"), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "on" means that the conduction channel of the FET is present and drain current may flow through the FET. References herein to a FET being "off" means that the conduction channel is not present and drain current does not flow through the FET. An "off" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Modifications are possible in the described embodiments, and other embodiments are possible, within the scope of the claims.

What is claimed is:

1. An apparatus comprising:

a charge transfer circuit having a first terminal, a second terminal, a third terminal, and a control input, the charge transfer circuit including an energy storage device and a current sensor configurable to measure a current passing though the energy storage device;

a control circuit having a control output coupled to the control input, wherein the control circuit is configured to control the charge transfer circuit to:

charge the energy storage device using a first current passing through the second and third terminals and the energy storage device while measuring the first current;

discharge the energy storage device through the first and second terminals;

charge the energy storage device using a second current passing through the first and second terminals and the energy storage device while measuring the second current; and discharge the energy storage device through the second and third terminals; and a processing circuit having a first input, a second input, and an output, the processing circuit configured to:

receive a first signal at the first input, the first signal representing at least one of the first current or the second current;

receive a second signal at the second input, the second signal representing at least one of a first voltage between the first and second terminals or a second voltage between the second and third terminals; and provide a third signal based on the first and second signals at the output.

2. The apparatus of claim 1, wherein the charge transfer circuit is configured to:

responsive to the control input having a first state, transfer a first charge from the second terminal through the charge transfer circuit to the third terminal; and responsive to the control input having a second state, transfer a second charge from the second terminal through the charge transfer circuit to the first terminal.

3. The apparatus of claim 2, wherein the charge transfer circuit is configured to charge the energy storage device using the first charge and provide the second charge by discharging the energy storage device.

4. The apparatus of claim 1, wherein the energy storage device includes an inductor and a capacitor.

5. The apparatus of claim 1, wherein the current sensor is coupled to the energy storage device, the current sensor having an output coupled to the first input of the processing circuit.

6. The apparatus of claim 1, wherein the charge transfer circuit includes a transformer.

7. The apparatus of claim 1, wherein the charge transfer circuit, the control circuit, and the processing circuit are part of an integrated circuit (IC), and the energy storage device is external to the IC.

8. The apparatus of claim 1, wherein the charge transfer circuit includes a first half-bridge circuit coupled between the first terminal and the second terminal and a second half-bridge circuit coupled between the second terminal and the third terminal.

9. The apparatus of claim 1, wherein the control circuit is configured to provide a control signal at the control output to:

cause a first periodic current to flow from the second terminal through the charge transfer circuit to the third terminal; and cause a second periodic current to flow from the third terminal through the charge transfer circuit to the first terminal.

10. The apparatus of claim 1, wherein the processing circuit is configured to provide the third signal representing an impedance spectroscopy of a DUT.

11. A system comprising:

a charge transfer circuit having a first device under test (DUT) terminal, a second DUT terminal, a third DUT terminal, a first current terminal, a second current terminal, and a control input;

an energy storage device and a current sensor coupled between the first and second current terminals, the current sensor having a current sensor output and configurable to measure a current passing through the first and second current terminals and the energy storage device;

a control circuit having a control output coupled to the control input, the control circuit configured to control the charge transfer circuit to perform at least one of:

charging the energy storage device using a first current passing through the second and third DUT terminals and the first and second current terminals while measuring the first current using the current sensor, and discharging the energy storage device through the first and second DUT terminals; or charging the energy storage device using a second current passing through the first and second DUT terminals and the first and second current terminals while measuring the second current using the current sensor, and discharging the energy storage device through the second and third DUT terminals;

a first voltage sensor coupled between the first and second DUT terminals, the first voltage sensor having a first voltage sensor output;

a second voltage sensor coupled between the second and third DUT terminals, the second voltage sensor having a second voltage sensor output; and a processing circuit having first, second, and third sense inputs and an output, the first sense input is coupled to the first voltage sensor output, the second sense input is coupled to the second voltage sensor output, and the third sense input is coupled to the current sensor output.

12. The system of claim 11, wherein the charge transfer circuit is a first charge transfer circuit, the control input is a first control input, the control output is a first control output, the energy storage device is a first energy storage device, the current sensor is a first current sensor, the current sensor output is a first current sensor output, and the system further comprises:

a second charge transfer circuit having a fourth DUT terminal, a fifth DUT terminal, a sixth DUT terminal, a third current terminal, a fourth current terminal, and a second control input, the fourth DUT terminal coupled to the third DUT terminal;

a second energy storage device and a second current sensor coupled between the second and third current terminals, the second current sensor having a second current sensor output;

a third energy storage device and a third current sensor coupled between the third and fourth current terminals, the third current sensor having a third current sensor output;

a third voltage sensor coupled between the fourth and fifth DUT terminals, the third voltage sensor having a third voltage sensor output;

a fourth voltage sensor coupled between the fifth and sixth DUT terminals, the fourth voltage sensor having a fourth voltage sensor output; and wherein the control circuit has a second control output coupled to the second control input, and the first, second, and third sense inputs are coupled to the second current sensor output and the third and fourth voltage sensor outputs.

13. The system of claim 11, further comprising a first DUT coupled between the first and second DUT terminals, and a second DUT coupled between the second and third DUT terminals.

14. The system of claim 13, wherein:

the first DUT includes one or more battery cells coupled between the first and second DUT terminals; and the second DUT include one or more battery cells coupled between the second and third DUT terminals.

15. The system of claim 11, wherein the energy storage device includes:

an inductor and a capacitor.

16. The system of claim 11, wherein the charge transfer circuit includes a first half-bridge circuit coupled between the first DUT terminal and the second DUT terminal, and a second half-bridge circuit coupled between the second DUT terminal and the third DUT terminal.

17. The system of claim 11, wherein the control circuit is configured to provide a control signal at the control output to:

cause a first periodic current to flow from the second DUT terminal through the charge transfer circuit to the third DUT terminal; and cause a second periodic current to flow from the third DUT terminal through the charge transfer circuit to the first DUT terminal.

18. A method comprising:

connecting a first device under test (DUT) to an energy storage device and a current sensor;

charging the energy storage device using a first current from the first DUT;

measuring the first current while charging the energy storage device using the first current from the first DUT;

disconnecting the first DUT from the energy storage device and connecting a second DUT to the energy storage device;

discharging the energy storage device to charge the second DUT;

measuring a first voltage across the first DUT; and generating a first impedance spectroscopy of the first DUT based on the first current and the first voltage.

19. The method of claim 18, further comprising:

charging the energy storage device using a second current from the second DUT;

measuring the second current while charging the energy storage device using the second current from the second DUT;

discharging the energy storage device to charge the first DUT;

measuring a second voltage across the second DUT; and generating a second impedance spectroscopy of the second DUT based on the second current and the second voltage.

20. The method of claim 18, wherein the energy storage device includes at least one of: a circuit including an inductor and a capacitor.

* * * * *